US009276561B2

(12) United States Patent
Clark et al.

(10) Patent No.: US 9,276,561 B2
(45) Date of Patent: Mar. 1, 2016

(54) INTEGRATED CIRCUIT PROCESS AND BIAS MONITORS AND RELATED METHODS

(71) Applicant: MIE Fujitsu Semiconductor Limited, Kuwana, MIE (JP)

(72) Inventors: Lawrence T. Clark, Phoenix, AZ (US); David A. Kidd, San Jose, CA (US); Chao-Wu Chen, San Jose, CA (US)

(73) Assignee: MIE Fujitsu Semiconductor Limited, Kuwana, Mie (JP)

( * ) Notice: Subject to any disclaimer, the term of this patent is extended or adjusted under 35 U.S.C. 154(b) by 0 days.

(21) Appl. No.: 14/808,358

(22) Filed: Jul. 24, 2015

(65) Prior Publication Data

US 2015/0333738 A1    Nov. 19, 2015

Related U.S. Application Data

(63) Continuation of application No. 14/136,258, filed on Dec. 20, 2013, now Pat. No. 9,112,484.

(60) Provisional application No. 61/740,339, filed on Dec. 20, 2012.

(51) Int. Cl.
*H03K 3/03* (2006.01)
*H03K 3/011* (2006.01)
(Continued)

(52) U.S. Cl.
CPC ............... *H03K 3/011* (2013.01); *G05F 3/205* (2013.01); *G05F 3/262* (2013.01); *H03K 3/0315* (2013.01)

(58) Field of Classification Search
CPC ...... H03K 3/0315; H03K 3/011; G05F 3/262; G05F 3/205
USPC .................................................... 331/57, 44
See application file for complete search history.

(56) References Cited

U.S. PATENT DOCUMENTS

| 3,958,266 A | 5/1976 | Athanas |
| 4,000,504 A | 12/1976 | Berger |
| 4,021,835 A | 5/1977 | Etoh |

(Continued)

FOREIGN PATENT DOCUMENTS

| EP | 0274278 | 7/1988 |
| EP | 0312237 | 4/1989 |

(Continued)

OTHER PUBLICATIONS

Banerjee, et al. "Compensating Non-Optical Effects using Electrically-Driven Optical Proximity Correction", Proc. of SPIE vol. 7275 72750E, 2009.

(Continued)

*Primary Examiner* — Ryan Johnson
(74) *Attorney, Agent, or Firm* — Baker Botts L.L.P.

(57) ABSTRACT

An integrated circuit device can include at least one oscillator stage having a current mirror circuit comprising first and second mirror transistors of a first conductivity type, and configured to mirror current on two mirror paths, at least one reference transistor of a second conductivity type having a source-drain path coupled to a first of the mirror paths, and a switching circuit coupled to a second of the mirror paths and configured to generate a transition in a stage output signal in response to a stage input signal received from another oscillator stage, wherein the channel lengths of the first and second mirror transistors are larger than that of the at least one reference transistor.

2 Claims, 9 Drawing Sheets

(51) Int. Cl.
*G05F 3/26* (2006.01)
*G05F 3/20* (2006.01)

(56) References Cited

U.S. PATENT DOCUMENTS

| | | |
|---|---|---|
| 4,242,691 A | 12/1980 | Kotani |
| 4,276,095 A | 6/1981 | Beilstein, Jr. |
| 4,315,781 A | 2/1982 | Henderson |
| 4,356,412 A * | 10/1982 | Moench .......... G05F 3/205 327/537 |
| 4,518,926 A | 5/1985 | Swanson |
| 4,559,091 A | 12/1985 | Allen |
| 4,578,128 A | 3/1986 | Mundt |
| 4,617,066 A | 10/1986 | Vasudev |
| 4,662,061 A | 5/1987 | Malhi |
| 4,761,384 A | 8/1988 | Neppl |
| 4,780,748 A | 10/1988 | Cunningham |
| 4,819,043 A | 4/1989 | Yazawa |
| 4,885,477 A | 12/1989 | Bird |
| 4,908,681 A | 3/1990 | Nishida |
| 4,945,254 A | 7/1990 | Robbins |
| 4,956,311 A | 9/1990 | Liou |
| 5,034,337 A | 7/1991 | Mosher |
| 5,144,378 A | 9/1992 | Hikosaka |
| 5,156,989 A | 10/1992 | Williams |
| 5,156,990 A | 10/1992 | Mitchell |
| 5,166,765 A | 11/1992 | Lee |
| 5,208,473 A | 5/1993 | Komori |
| 5,294,821 A | 3/1994 | Iwamatsu |
| 5,298,763 A | 3/1994 | Shen |
| 5,369,288 A | 11/1994 | Usuki |
| 5,373,186 A | 12/1994 | Schubert |
| 5,384,476 A | 1/1995 | Nishizawa |
| 5,426,328 A | 6/1995 | Yilmaz |
| 5,444,008 A | 8/1995 | Han |
| 5,446,418 A | 8/1995 | Hara et al. |
| 5,552,332 A | 9/1996 | Tseng |
| 5,559,368 A | 9/1996 | Hu |
| 5,608,253 A | 3/1997 | Liu |
| 5,622,880 A | 4/1997 | Burr |
| 5,624,863 A | 4/1997 | Helm |
| 5,625,568 A | 4/1997 | Edwards |
| 5,641,980 A | 6/1997 | Yamaguchi |
| 5,663,583 A | 9/1997 | Matloubian |
| 5,712,501 A | 1/1998 | Davies |
| 5,719,422 A | 2/1998 | Burr |
| 5,726,488 A | 3/1998 | Watanabe |
| 5,726,562 A | 3/1998 | Mizuno |
| 5,731,626 A | 3/1998 | Eaglesham |
| 5,736,419 A | 4/1998 | Naem |
| 5,753,555 A | 5/1998 | Hada |
| 5,754,826 A | 5/1998 | Gamal |
| 5,756,365 A | 5/1998 | Kakumu |
| 5,763,921 A | 6/1998 | Okumura |
| 5,780,899 A | 7/1998 | Hu |
| 5,847,419 A | 12/1998 | Imai |
| 5,856,003 A | 1/1999 | Chiu |
| 5,861,334 A | 1/1999 | Rho |
| 5,877,049 A | 3/1999 | Liu |
| 5,885,876 A | 3/1999 | Dennen |
| 5,889,315 A | 3/1999 | Farrenkopf |
| 5,895,954 A | 4/1999 | Yasumura |
| 5,899,714 A | 5/1999 | Farrenkopf |
| 5,905,412 A | 5/1999 | Rasmussen |
| 5,918,129 A | 6/1999 | Fulford, Jr. |
| 5,923,067 A | 7/1999 | Voldman |
| 5,923,987 A | 7/1999 | Burr |
| 5,936,868 A | 8/1999 | Hall |
| 5,946,214 A | 8/1999 | Heavlin |
| 5,985,705 A | 11/1999 | Seliskar |
| 5,989,963 A | 11/1999 | Luning |
| 6,001,695 A | 12/1999 | Wu |
| 6,020,227 A | 2/2000 | Bulucea |
| 6,043,139 A | 3/2000 | Eaglesham |
| 6,060,345 A | 5/2000 | Hause |
| 6,060,364 A | 5/2000 | Maszara |
| 6,066,533 A | 5/2000 | Yu |
| 6,072,217 A | 6/2000 | Burr |
| 6,087,210 A | 7/2000 | Sohn |
| 6,087,691 A | 7/2000 | Hamamoto |
| 6,088,518 A | 7/2000 | Hsu |
| 6,091,286 A | 7/2000 | Blauschild |
| 6,096,611 A | 8/2000 | Wu |
| 6,103,562 A | 8/2000 | Son |
| 6,121,153 A | 9/2000 | Kikkawa |
| 6,147,383 A | 11/2000 | Kuroda |
| 6,153,920 A | 11/2000 | Gossmann |
| 6,157,073 A | 12/2000 | Lehongres |
| 6,175,582 B1 | 1/2001 | Naito |
| 6,184,112 B1 | 2/2001 | Maszara |
| 6,190,979 B1 | 2/2001 | Radens |
| 6,194,259 B1 | 2/2001 | Nayak |
| 6,198,157 B1 | 3/2001 | Ishida |
| 6,218,892 B1 | 4/2001 | Soumyanath |
| 6,218,895 B1 | 4/2001 | De |
| 6,221,724 B1 | 4/2001 | Yu |
| 6,229,188 B1 | 5/2001 | Aoki |
| 6,232,164 B1 | 5/2001 | Tsai |
| 6,235,597 B1 | 5/2001 | Miles |
| 6,245,618 B1 | 6/2001 | An |
| 6,268,640 B1 | 7/2001 | Park |
| 6,271,070 B2 | 8/2001 | Kotani |
| 6,271,551 B1 | 8/2001 | Schmitz |
| 6,288,429 B1 | 9/2001 | Iwata |
| 6,297,132 B1 | 10/2001 | Zhang |
| 6,300,177 B1 | 10/2001 | Sundaresan |
| 6,313,489 B1 | 11/2001 | Letavic |
| 6,319,799 B1 | 11/2001 | Ouyang |
| 6,320,222 B1 | 11/2001 | Forbes |
| 6,323,525 B1 | 11/2001 | Noguchi |
| 6,326,666 B1 | 12/2001 | Bernstein |
| 6,335,233 B1 | 1/2002 | Cho |
| 6,358,806 B1 | 3/2002 | Puchner |
| 6,380,019 B1 | 4/2002 | Yu |
| 6,391,752 B1 | 5/2002 | Colinge |
| 6,426,260 B1 | 7/2002 | Hshieh |
| 6,426,279 B1 | 7/2002 | Huster |
| 6,432,754 B1 | 8/2002 | Assaderaghi |
| 6,444,550 B1 | 9/2002 | Hao |
| 6,444,551 B1 | 9/2002 | Ku |
| 6,449,749 B1 | 9/2002 | Stine |
| 6,461,920 B1 | 10/2002 | Shirahata |
| 6,461,928 B2 | 10/2002 | Rodder |
| 6,472,278 B1 | 10/2002 | Marshall |
| 6,482,714 B1 | 11/2002 | Hieda |
| 6,489,224 B1 | 12/2002 | Burr |
| 6,492,232 B1 | 12/2002 | Tang |
| 6,500,739 B1 | 12/2002 | Wang |
| 6,503,801 B1 | 1/2003 | Rouse |
| 6,503,805 B2 | 1/2003 | Wang |
| 6,506,640 B1 | 1/2003 | Ishida |
| 6,518,623 B1 | 2/2003 | Oda |
| 6,521,470 B1 | 2/2003 | Lin |
| 6,534,373 B1 | 3/2003 | Yu |
| 6,541,328 B2 | 4/2003 | Whang |
| 6,541,829 B2 | 4/2003 | Nishinohara |
| 6,548,842 B1 | 4/2003 | Bulucea |
| 6,551,885 B1 | 4/2003 | Yu |
| 6,552,377 B1 | 4/2003 | Yu |
| 6,573,129 B2 | 6/2003 | Hoke |
| 6,576,535 B2 | 6/2003 | Drobny |
| 6,600,200 B1 | 7/2003 | Lustig |
| 6,620,671 B1 | 9/2003 | Wang |
| 6,624,488 B1 | 9/2003 | Kim |
| 6,627,473 B1 | 9/2003 | Oikawa |
| 6,630,710 B1 | 10/2003 | Augusto |
| 6,660,605 B1 | 12/2003 | Liu |
| 6,662,350 B2 | 12/2003 | Fried |
| 6,667,200 B2 | 12/2003 | Sohn |
| 6,670,260 B1 | 12/2003 | Yu |
| 6,693,333 B1 | 2/2004 | Yu |
| 6,730,568 B2 | 5/2004 | Sohn |
| 6,737,724 B2 | 5/2004 | Hieda |
| 6,743,291 B2 | 6/2004 | Ang |

(56) References Cited

U.S. PATENT DOCUMENTS

| | | |
|---|---|---|
| 6,743,684 B2 | 6/2004 | Liu |
| 6,751,519 B1 | 6/2004 | Satya |
| 6,753,230 B2 | 6/2004 | Sohn |
| 6,760,900 B2 | 7/2004 | Rategh |
| 6,770,944 B2 | 8/2004 | Nishinohara |
| 6,787,424 B1 | 9/2004 | Yu |
| 6,797,553 B2 | 9/2004 | Adkisson |
| 6,797,602 B1 | 9/2004 | Kluth |
| 6,797,994 B1 | 9/2004 | Hoke |
| 6,808,004 B2 | 10/2004 | Kamm |
| 6,808,994 B1 | 10/2004 | Wang |
| 6,813,750 B2 | 11/2004 | Usami |
| 6,821,825 B2 | 11/2004 | Todd |
| 6,821,852 B2 | 11/2004 | Rhodes |
| 6,822,297 B2 | 11/2004 | Nandakumar |
| 6,831,292 B2 | 12/2004 | Currie |
| 6,835,639 B2 | 12/2004 | Rotondaro |
| 6,852,602 B2 | 2/2005 | Kanzawa |
| 6,852,603 B2 | 2/2005 | Chakravarthi |
| 6,881,641 B2 | 4/2005 | Wieczorek |
| 6,881,987 B2 | 4/2005 | Sohn |
| 6,891,439 B2 | 5/2005 | Jaehne |
| 6,893,947 B2 | 5/2005 | Mmtinez |
| 6,900,519 B2 | 5/2005 | Cantell |
| 6,901,564 B2 | 5/2005 | Stine |
| 6,916,698 B2 | 7/2005 | Mocuta |
| 6,917,237 B1 | 7/2005 | Tschanz |
| 6,927,463 B2 | 8/2005 | Iwata |
| 6,928,128 B1 | 8/2005 | Sidiropoulos |
| 6,930,007 B2 | 8/2005 | Bu |
| 6,930,360 B2 | 8/2005 | Yamauchi |
| 6,957,163 B2 | 10/2005 | Ando |
| 6,963,090 B2 | 11/2005 | Passlack |
| 6,995,397 B2 | 2/2006 | Yamashita |
| 7,002,214 B1 | 2/2006 | Boyd |
| 7,008,836 B2 | 3/2006 | Algotsson |
| 7,013,359 B1 | 3/2006 | Li |
| 7,015,546 B2 | 3/2006 | Herr |
| 7,015,741 B2 | 3/2006 | Tschanz |
| 7,022,559 B2 | 4/2006 | Barnak |
| 7,036,098 B2 | 4/2006 | Eleyan |
| 7,038,258 B2 | 5/2006 | Liu |
| 7,039,881 B2 | 5/2006 | Regan |
| 7,045,456 B2 | 5/2006 | Murto |
| 7,057,216 B2 | 6/2006 | Ouyang |
| 7,061,058 B2 | 6/2006 | Chakravarthi |
| 7,064,039 B2 | 6/2006 | Liu |
| 7,064,399 B2 | 6/2006 | Babcock |
| 7,071,103 B2 | 7/2006 | Chan |
| 7,078,325 B2 | 7/2006 | Curello |
| 7,078,776 B2 | 7/2006 | Nishinohara |
| 7,089,513 B2 | 8/2006 | Bard |
| 7,089,515 B2 | 8/2006 | Hanafi |
| 7,091,093 B1 | 8/2006 | Noda |
| 7,105,399 B1 | 9/2006 | Dakshina-Murthy |
| 7,109,099 B2 | 9/2006 | Tan |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch |
| 7,169,675 B2 | 1/2007 | Tan |
| 7,170,120 B2 | 1/2007 | Datta |
| 7,176,137 B2 | 2/2007 | Perng |
| 7,186,598 B2 | 3/2007 | Yamauchi |
| 7,189,627 B2 | 3/2007 | Wu |
| 7,199,430 B2 | 4/2007 | Babcock |
| 7,202,517 B2 | 4/2007 | Dixit |
| 7,208,354 B2 | 4/2007 | Bauer |
| 7,211,871 B2 | 5/2007 | Cho |
| 7,221,021 B2 | 5/2007 | Wu |
| 7,223,646 B2 | 5/2007 | Miyashita |
| 7,226,833 B2 | 6/2007 | White |
| 7,226,843 B2 | 6/2007 | Weber |
| 7,230,680 B2 | 6/2007 | Fujisawa |
| 7,235,822 B2 | 6/2007 | Li |
| 7,256,639 B1 | 8/2007 | Koniaris |
| 7,259,428 B2 | 8/2007 | Inaba |
| 7,260,562 B2 | 8/2007 | Czajkowski |
| 7,294,877 B2 | 11/2007 | Rueckes |
| 7,297,994 B2 | 11/2007 | Wieczorek |
| 7,301,208 B2 | 11/2007 | Handa |
| 7,304,350 B2 | 12/2007 | Misaki |
| 7,307,471 B2 | 12/2007 | Gammie |
| 7,312,500 B2 | 12/2007 | Miyashita |
| 7,323,754 B2 | 1/2008 | Ema |
| 7,332,439 B2 | 2/2008 | Lindert |
| 7,338,817 B2 * | 3/2008 | Liu .............. G01R 31/2642 438/10 |
| 7,348,629 B2 | 3/2008 | Chu |
| 7,354,833 B2 | 4/2008 | Liaw |
| 7,380,225 B2 | 5/2008 | Joshi |
| 7,398,497 B2 | 7/2008 | Sato |
| 7,402,207 B1 | 7/2008 | Besser |
| 7,402,872 B2 | 7/2008 | Murthy |
| 7,416,605 B2 | 8/2008 | Zollner |
| 7,427,788 B2 | 9/2008 | Li |
| 7,442,971 B2 | 10/2008 | Wirbeleit |
| 7,449,733 B2 | 11/2008 | Inaba |
| 7,462,908 B2 | 12/2008 | Bo |
| 7,469,164 B2 | 12/2008 | Du-Nour |
| 7,470,593 B2 | 12/2008 | Rouh |
| 7,485,536 B2 | 2/2009 | Jin |
| 7,487,474 B2 | 2/2009 | Ciplickas |
| 7,491,988 B2 | 2/2009 | Tolchinsky |
| 7,494,861 B2 | 2/2009 | Chu |
| 7,495,519 B2 | 2/2009 | Kim et al. |
| 7,496,862 B2 | 2/2009 | Chang |
| 7,496,867 B2 | 2/2009 | Turner |
| 7,498,637 B2 | 3/2009 | Yamaoka |
| 7,501,324 B2 | 3/2009 | Babcock |
| 7,503,020 B2 | 3/2009 | Allen |
| 7,507,999 B2 | 3/2009 | Kusumoto |
| 7,514,766 B2 | 4/2009 | Yoshida |
| 7,521,323 B2 | 4/2009 | Surdeanu |
| 7,531,393 B2 | 5/2009 | Doyle |
| 7,531,836 B2 | 5/2009 | Liu |
| 7,538,364 B2 | 5/2009 | Twynam |
| 7,538,412 B2 | 5/2009 | Schulze |
| 7,562,233 B1 | 7/2009 | Sheng |
| 7,564,105 B2 | 7/2009 | Chi |
| 7,566,600 B2 | 7/2009 | Mouli |
| 7,569,456 B2 | 8/2009 | Ko |
| 7,586,322 B1 | 9/2009 | Xu |
| 7,592,241 B2 | 9/2009 | Takao |
| 7,595,243 B1 | 9/2009 | Bulucea |
| 7,598,142 B2 | 10/2009 | Ranade |
| 7,605,041 B2 | 10/2009 | Ema |
| 7,605,060 B2 | 10/2009 | Meunier-Beillard |
| 7,605,429 B2 | 10/2009 | Bernstein |
| 7,608,496 B2 | 10/2009 | Chu |
| 7,615,802 B2 | 11/2009 | Elpelt |
| 7,622,341 B2 | 11/2009 | Chudzik |
| 7,638,380 B2 | 12/2009 | Pearce |
| 7,642,140 B2 | 1/2010 | Bae |
| 7,644,377 B1 | 1/2010 | Saxe |
| 7,645,665 B2 | 1/2010 | Kubo |
| 7,651,920 B2 | 1/2010 | Siprak |
| 7,655,523 B2 | 2/2010 | Babcock |
| 7,673,273 B2 | 3/2010 | Madurawe |
| 7,675,126 B2 | 3/2010 | Cho |
| 7,675,317 B2 | 3/2010 | Perisetty |
| 7,678,638 B2 | 3/2010 | Chu |
| 7,681,628 B2 | 3/2010 | Joshi |
| 7,682,887 B2 | 3/2010 | Dokumaci |
| 7,683,442 B1 | 3/2010 | Burr |
| 7,696,000 B2 | 4/2010 | Liu |
| 7,704,822 B2 | 4/2010 | Jeong |
| 7,704,844 B2 | 4/2010 | Zhu |
| 7,709,828 B2 | 5/2010 | Braithwaite |
| 7,723,750 B2 | 5/2010 | Zhu |
| 7,737,472 B2 | 6/2010 | Kondo |
| 7,741,138 B2 | 6/2010 | Cho |
| 7,741,200 B2 | 6/2010 | Cho |
| 7,745,270 B2 | 6/2010 | Shah |

(56) References Cited

U.S. PATENT DOCUMENTS

| | | | |
|---|---|---|---|
| 7,750,374 | B2 | 7/2010 | Capasso |
| 7,750,381 | B2 | 7/2010 | Hokazono |
| 7,750,405 | B2 | 7/2010 | Nowak |
| 7,750,682 | B2 | 7/2010 | Bernstein |
| 7,755,144 | B2 | 7/2010 | Li |
| 7,755,146 | B2 | 7/2010 | Helm |
| 7,759,206 | B2 | 7/2010 | Luo |
| 7,759,714 | B2 | 7/2010 | Itoh |
| 7,761,820 | B2 | 7/2010 | Berger |
| 7,795,677 | B2 | 9/2010 | Bangsaruntip |
| 7,808,045 | B2 | 10/2010 | Kawahara |
| 7,808,410 | B2 | 10/2010 | Kim |
| 7,811,873 | B2 | 10/2010 | Mochizuki |
| 7,811,881 | B2 | 10/2010 | Cheng |
| 7,818,702 | B2 | 10/2010 | Mandelman |
| 7,821,066 | B2 | 10/2010 | Lebby |
| 7,829,402 | B2 | 11/2010 | Matocha |
| 7,831,873 | B1 | 11/2010 | Trimberger |
| 7,846,822 | B2 | 12/2010 | Seebauer |
| 7,855,118 | B2 | 12/2010 | Hoentschel |
| 7,859,013 | B2 | 12/2010 | Chen |
| 7,863,163 | B2 | 1/2011 | Bauer |
| 7,867,835 | B2 | 1/2011 | Lee |
| 7,883,977 | B2 | 2/2011 | Babcock |
| 7,888,205 | B2 | 2/2011 | Herner |
| 7,888,747 | B2 | 2/2011 | Hokazono |
| 7,895,546 | B2 | 2/2011 | Lahner |
| 7,897,495 | B2 | 3/2011 | Ye |
| 7,906,413 | B2 | 3/2011 | Cardone |
| 7,906,813 | B2 | 3/2011 | Kato |
| 7,910,419 | B2 | 3/2011 | Fenouillet-Beranger |
| 7,919,791 | B2 | 4/2011 | Flynn |
| 7,926,018 | B2 | 4/2011 | Moroz |
| 7,935,984 | B2 | 5/2011 | Nakano |
| 7,941,776 | B2 | 5/2011 | Majumder |
| 7,945,800 | B2 | 5/2011 | Gomm |
| 7,948,008 | B2 | 5/2011 | Liu |
| 7,952,147 | B2 | 5/2011 | Ueno |
| 7,960,232 | B2 | 6/2011 | King |
| 7,960,238 | B2 | 6/2011 | Kohli |
| 7,968,400 | B2 | 6/2011 | Cai |
| 7,968,411 | B2 | 6/2011 | Williford |
| 7,968,440 | B2 | 6/2011 | Seebauer |
| 7,968,459 | B2 | 6/2011 | Bedell |
| 7,989,900 | B2 | 8/2011 | Haensch |
| 7,994,573 | B2 | 8/2011 | Pan |
| 8,004,024 | B2 | 8/2011 | Furukawa |
| 8,012,827 | B2 | 9/2011 | Yu |
| 8,029,620 | B2 | 10/2011 | Kim |
| 8,039,332 | B2 | 10/2011 | Bernard |
| 8,046,598 | B2 | 10/2011 | Lee |
| 8,048,791 | B2 | 11/2011 | Hargrove |
| 8,048,810 | B2 | 11/2011 | Tsai |
| 8,051,340 | B2 | 11/2011 | Cranford, Jr. |
| 8,053,340 | B2 | 11/2011 | Colombeau |
| 8,063,466 | B2 | 11/2011 | Kurita |
| 8,067,279 | B2 | 11/2011 | Sadra |
| 8,067,280 | B2 | 11/2011 | Wang |
| 8,067,302 | B2 | 11/2011 | Li |
| 8,076,719 | B2 | 12/2011 | Zeng |
| 8,097,529 | B2 | 1/2012 | Krull |
| 8,103,983 | B2 | 1/2012 | Agarwal |
| 8,105,891 | B2 | 1/2012 | Yeh |
| 8,106,424 | B2 | 1/2012 | Schruefer |
| 8,106,481 | B2 | 1/2012 | Rao |
| 8,110,487 | B2 | 2/2012 | Griebenow |
| 8,114,761 | B2 | 2/2012 | Mandrekar |
| 8,119,482 | B2 | 2/2012 | Bhalla |
| 8,120,069 | B2 | 2/2012 | Hynecek |
| 8,129,246 | B2 | 3/2012 | Babcock |
| 8,129,797 | B2 | 3/2012 | Chen |
| 8,134,159 | B2 | 3/2012 | Hokazono |
| 8,143,120 | B2 | 3/2012 | Ken |
| 8,143,124 | B2 | 3/2012 | Challa |
| 8,143,678 | B2 | 3/2012 | Kim |
| 8,148,774 | B2 | 4/2012 | Mori |
| 8,163,619 | B2 | 4/2012 | Yang |
| 8,169,002 | B2 | 5/2012 | Chang |
| 8,170,857 | B2 | 5/2012 | Joshi |
| 8,173,499 | B2 | 5/2012 | Chung |
| 8,173,502 | B2 | 5/2012 | Yan |
| 8,176,461 | B1 | 5/2012 | Trimberger |
| 8,178,430 | B2 | 5/2012 | Kim |
| 8,179,530 | B2 | 5/2012 | Levy |
| 8,183,096 | B2 | 5/2012 | Wirbeleit |
| 8,183,107 | B2 | 5/2012 | Mathur |
| 8,185,865 | B2 | 5/2012 | Gupta |
| 8,187,959 | B2 | 5/2012 | Pawlak |
| 8,188,542 | B2 | 5/2012 | Yoo |
| 8,196,545 | B2 | 6/2012 | Kurosawa |
| 8,201,122 | B2 | 6/2012 | Dewey, III |
| 8,214,190 | B2 | 7/2012 | Joshi |
| 8,217,423 | B2 | 7/2012 | Liu |
| 8,225,255 | B2 | 7/2012 | Ouyang |
| 8,227,307 | B2 | 7/2012 | Chen |
| 8,236,661 | B2 | 8/2012 | Dennard |
| 8,239,803 | B2 | 8/2012 | Kobayashi |
| 8,247,300 | B2 | 8/2012 | Babcock |
| 8,255,843 | B2 | 8/2012 | Chen |
| 8,258,026 | B2 | 9/2012 | Bulucea |
| 8,266,567 | B2 | 9/2012 | El Yahyaoui |
| 8,286,180 | B2 | 10/2012 | Foo |
| 8,288,798 | B2 | 10/2012 | Passlack |
| 8,299,562 | B2 | 10/2012 | Li |
| 8,324,059 | B2 | 12/2012 | Guo |
| 8,552,795 | B2 * | 10/2013 | Chi ................... G05F 3/205 323/907 |
| 2001/0014495 | A1 | 8/2001 | Yu |
| 2002/0042184 | A1 | 4/2002 | Nandakumar |
| 2002/0186072 | A1 | 12/2002 | Mano et al. |
| 2003/0006415 | A1 | 1/2003 | Yokogawa |
| 2003/0047763 | A1 | 3/2003 | Hieda |
| 2003/0122203 | A1 | 7/2003 | Nishinohara |
| 2003/0173626 | A1 | 9/2003 | Burr |
| 2003/0183856 | A1 | 10/2003 | Wieczorek |
| 2003/0215992 | A1 | 11/2003 | Sohn |
| 2004/0075118 | A1 | 4/2004 | Heinemann |
| 2004/0075143 | A1 | 4/2004 | Bae |
| 2004/0084731 | A1 | 5/2004 | Matsuda |
| 2004/0087090 | A1 | 5/2004 | Grudowski |
| 2004/0126947 | A1 | 7/2004 | Sohn |
| 2004/0175893 | A1 | 9/2004 | Vatus |
| 2004/0180488 | A1 | 9/2004 | Lee |
| 2005/0106824 | A1 | 5/2005 | Alberto |
| 2005/0116282 | A1 | 6/2005 | Pattanayak |
| 2005/0250289 | A1 | 11/2005 | Babcock |
| 2005/0280075 | A1 | 12/2005 | Ema |
| 2006/0022270 | A1 | 2/2006 | Boyd |
| 2006/0049464 | A1 | 3/2006 | Rao |
| 2006/0068555 | A1 | 3/2006 | Zhu et al. |
| 2006/0068586 | A1 | 3/2006 | Pain |
| 2006/0071278 | A1 | 4/2006 | Takao |
| 2006/0154428 | A1 | 7/2006 | Dokumaci |
| 2006/0197158 | A1 | 9/2006 | Babcock |
| 2006/0203581 | A1 | 9/2006 | Joshi |
| 2006/0220114 | A1 | 10/2006 | Miyashita |
| 2006/0223248 | A1 | 10/2006 | Venugopal |
| 2007/0040222 | A1 | 2/2007 | Van Camp |
| 2007/0117326 | A1 | 5/2007 | Tan |
| 2007/0158790 | A1 | 7/2007 | Rao |
| 2007/0212861 | A1 | 9/2007 | Chidambarrao |
| 2007/0238253 | A1 | 10/2007 | Tucker |
| 2008/0067589 | A1 | 3/2008 | Ito |
| 2008/0108208 | A1 | 5/2008 | Arevalo |
| 2008/0169493 | A1 | 7/2008 | Lee |
| 2008/0169516 | A1 | 7/2008 | Chung |
| 2008/0197439 | A1 | 8/2008 | Goerlach |
| 2008/0227250 | A1 | 9/2008 | Ranade |
| 2008/0237661 | A1 | 10/2008 | Ranade |
| 2008/0258198 | A1 | 10/2008 | Bojarczuk |
| 2008/0272409 | A1 | 11/2008 | Sonkusale |
| 2009/0057746 | A1 | 3/2009 | Sugll |
| 2009/0108350 | A1 | 4/2009 | Cai |
| 2009/0134468 | A1 | 5/2009 | Tsuchiya |

(56) References Cited

U.S. PATENT DOCUMENTS

| | | |
|---|---|---|
| 2009/0224319 A1 | 9/2009 | Kohli |
| 2009/0302388 A1 | 12/2009 | Cai |
| 2009/0309140 A1 | 12/2009 | Khamankar |
| 2009/0311837 A1 | 12/2009 | Kapoor |
| 2009/0321849 A1 | 12/2009 | Miyamura |
| 2010/0012988 A1 | 1/2010 | Yang |
| 2010/0038724 A1 | 2/2010 | Anderson |
| 2010/0100856 A1 | 4/2010 | Mittal |
| 2010/0148153 A1 | 6/2010 | Hudait |
| 2010/0149854 A1 | 6/2010 | Vora |
| 2010/0187641 A1 | 7/2010 | Zhu |
| 2010/0207182 A1 | 8/2010 | Paschal |
| 2010/0270600 A1 | 10/2010 | Inukai |
| 2011/0059588 A1 | 3/2011 | Kang |
| 2011/0073961 A1 | 3/2011 | Dennard |
| 2011/0074498 A1 | 3/2011 | Thompson |
| 2011/0079860 A1 | 4/2011 | Verhulst |
| 2011/0079861 A1 | 4/2011 | Shifren |
| 2011/0095811 A1 | 4/2011 | Chi |
| 2011/0147828 A1 | 6/2011 | Murthy |
| 2011/0169082 A1 | 7/2011 | Zhu |
| 2011/0175170 A1 | 7/2011 | Wang |
| 2011/0180880 A1 | 7/2011 | Chudzik |
| 2011/0193164 A1 | 8/2011 | Zhu |
| 2011/0212590 A1 | 9/2011 | Wu |
| 2011/0230039 A1 | 9/2011 | Mowry |
| 2011/0242921 A1 | 10/2011 | Tran |
| 2011/0248352 A1 | 10/2011 | Shifren |
| 2011/0294278 A1 | 12/2011 | Eguchi |
| 2011/0309447 A1 | 12/2011 | Arghavani |
| 2012/0021594 A1 | 1/2012 | Gurtej |
| 2012/0034745 A1 | 2/2012 | Colombeau |
| 2012/0056275 A1 | 3/2012 | Cai |
| 2012/0065920 A1 | 3/2012 | Nagumo |
| 2012/0108050 A1 | 5/2012 | Chen |
| 2012/0132998 A1 | 5/2012 | Kwon |
| 2012/0138953 A1 | 6/2012 | Cai |
| 2012/0146155 A1 | 6/2012 | Joentschel |
| 2012/0167025 A1 | 6/2012 | Gillespie |
| 2012/0187491 A1 | 7/2012 | Zhu |
| 2012/0190177 A1 | 7/2012 | Kim |
| 2012/0223363 A1 | 9/2012 | Kronholz |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 10-0794094 | 1/2008 |
| WO | 2011/062788 | 5/2011 |

OTHER PUBLICATIONS

Cheng, et al. "Extremely Thin SOI (ETSOI) CMOS with Record Low Variability for Low Power System-on-Chip Aoolications", Electron Devices Meeting (IEDM), Dec. 2009.
Machine Translation of KR 10-0794094 submitted herewith.
Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.
Drennan, et al. "Implications of Proximity Effects for Analog Design", Custom Integrated Circuits Conference, pp. 169-176, Sep. 2006.
Hook, et al. "Lateral Ion Implant Straggle and Mask Proximity Effect", IEEE Transactions on Electron Devices, vol. 50, No. 9, pp. 1946-1951, Sep. 2003.
Hori, et al., "A 0.1 µm CMOS with a Step Channel Profile Formed by Ultra High Vacuum CVD and In-Situ Doped Ions", Proceedings of the International Electron Devices Meeting, New York, IEEE, US, pp. 909-911, Dec. 5, 1993.
Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.
Shao, et al., "Boron Diffusion in Silicon: The Anomalies and Control by Point Defect Engineering", Materials Science and Engineering R: Reports, vol. 42, No. 3-4, pp. 65-114, Nov. 1, 2003.
Sheu, et al. "Modeling the Well-Edge Proximity Effect in Highly Scaled MOSFETs", IEEE Transactions on Electron Devices, vol. 53, No. 11, Nos. 2792-2798, Nov. 2006.
Komaragiri, R. et al., "Depletion-Free Poly Gate Electrode Architecture for Sub 1 00 Nanometer CMOS Devices with High-K Gate Dielectrics", IEEE IEDM Tech Dig., San Francisco CA, 833-836, Dec. 13-15, 2004.
Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.
Wong, H et al., "Nanoscale CMOS", Proceedings of the IEEE, Vo. 87, No. 4, pp. 537-570, Apr. 1999.
Abiko, H et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24, 1995.
Chau, R et al., "A 50nm Depleted-Substrate CMOS Transistor (DST)", Electron Device Meeting 2001, IEDM Technical Digest, IEEE International, pp. 29.1.1-29.1.4, 2001.
Ducroquet, F et al. "Fully Depleted Silicon-on-Insulator nMOSFETs with Tensile Strained High Carbon Content Si i-vCv Channel", ECS 210th Meeting, Abstract 1033, 2006.
Ernst, I et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.
Goesele, U et al., "Diffusion Engineering by Carbon in Silicon", Mat. Res. Soc. Symp. vol. 610, 2000.
Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.
Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.
Holland, OW and Thomas, DK "A Method to Improve Activation of Implanted Dopants in SiC", Oak Ridge National Laboratory, Oak Ridge, TN, 2001.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, Po. 459-462, 1996.
Laveant, P. "Incorporation, Diffusion and Agglomeration of Carbon in Silicon", Solid State Phenomena, vols. 82-84, pp. 189-194, 2002.
Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.
Ohguro, T et al., "An 0.18-µm CMOS for Mixed Digital and Analog Applications with Zero- Volt-Vth Epitaxial-Channel MOSFET's", IEEE Transactions on Electron Devices, vol. 46, No. 7, pp. 1378-1383, Jul. 1999.
Pinacho, R et al., "Carbon in Silicon: Modeling of Diffusion and Clustering Mechanisms", Journal of Applied Physics, vol. 92, No. 3, pp. 1582-1588, Aug. 2002.
Robertson, LS et al., "The Effect of Impurities on Diffusion and Activation of Ion Implanted Boron in Silicon", Mat. Res. Soc. Symp. vol. 610, 2000.
Scholz, R et al., "Carbon-Induced Undersaturation of Silicon Self-Interstitials", Appl. Phys. Lett. 72(2), pp. 200-202, Jan. 1998.
Scholz, RF et al., "The Contribution of Vacancies to Carbon Out-Diffusion in Silicon", Appl. Phys. Lett., vol. 74, No. 3, pp. 392-394, Jan. 1999.

(56) References Cited

OTHER PUBLICATIONS

Stolk PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P. et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

Final Office Action issued in U.S. Appl. No. 13/469,201; 10 pgs, Apr. 9, 2015.

English Translation of JP 8153873 submitted herewith.

Chan et al., "DDRO: A Novel Performance Monitoring Methodology Based on Design-Dependent Ring Oscillators", IEEE International Symposium on Quality Electronic Design, Mar. 19, 2012.

Chen et al., "Fully On-Chip Temperature, Process, and Voltage Sensors", ISCAS, IEEE, 2010.

Datta, Basab and Burleson, Wayne et al., "A 45.6u2 13.4uW 7.1V/V Resolution Sub-Threshold Based Digital Process-Sensing Circuit in 45nm CMOS", GLSVLSI '11, Lausanne, Switzerland, May 2-14, 2011.

Ghosh, et al., "On-Chip Negative Bias Temperature Instability Sensor Using Slew Rate Monitoring Circuitry", IEEE International Symposium on Circuits and Systems, May 24-27, 2009.

Ghosh, et al., "On-Chip Process Variation Detection and Compensation for Parametric Yield Enhancement in Sub-100nm CMOS Technology", IEEE International Symposium on Circuits and Systems, IBM Austin Center for Advanced Studies, 2007.

Nan et al., "Dynamic Voltage and Frequency Scaling for Power-Constrained Design using Process Voltage and Temperature Sensor Circuits", Journal of Information Processing Systems, vol. 7, No. 1, Mar. 2011.

Tschanz, et al., "Adaptive Body Bias for Reducing Impacts of Die-to-Die and Within-Die Parameter Variations on Microprocessor Frequency and Leakage", IEEE Journal of Solid-State Circuits, vol. 37, No. 11, Nov. 2002.

Zhang et al., "An On-Chip Characterizing System for Within-Die Delay Variation Measurement of Individual Standard Cells in 65-nm CMOS", Design Automation Conference, Jan. 25-28, 2011.

Saxena et al., "Variation in Transistor Performance and Leakage in Nanometer-Scale Technologies", IEEE Transactions on Electron Devices, vol. 55, No. 1, Jan. 2008.

\* cited by examiner

INTEGRATED CIRCUIT PROCESS AND BIAS MONITORS AND RELATED METHODS

CROSS-REFERENCE TO RELATED APPLICATIONS

This non-provisional application is a continuation of U.S. application Ser. No. 14/136,258 filed Dec. 20, 2013 and entitled "Integrated Circuit Process and Bias Monitors and Related Methods", and claims the benefit of U.S. Provisional Application No. 61/740,339, entitled "Process and Bias Monitors and Related Methods", filed on Dec. 20, 2012 the entirety of which is hereby incorporated by reference.

TECHNICAL FIELD

The present invention relates generally to circuits to monitor integrated circuit performance, and more particularly to ring oscillator stages designed to reflect the performance of certain transistors types.

BACKGROUND

As process technology has scaled, it has become increasingly difficult to control the variation of transistor parameters because of a variety of factors, including, for example, Random Dopant Fluctuation (RDF). Other reasons for this variation include dopant scattering effect, such as the well proximity effect, that makes the placement of dopants in MOSFET transistors increasingly difficult as transistor size is reduced. Misplaced dopants can reduce transistor performance, increase transistor variability, including variability of channel transconductance, capacitance effects, threshold voltage, and leakage. Such variability increases as transistors are reduced in size, with each misplaced dopant atom having a greater relative effect on transistor properties, as a result of the overall reduction in the number of dopant atoms.

Many integrated circuit (IC) devices use a variety of cells that perform specific functions. IC devices can include logic, memory, controller and other functional blocks. Semiconductor IC devices are fabricated in a semiconductor process, often using a complementary metal-oxide-semiconductor (CMOS) process. Transistors are formed in a semiconductor substrate, and usually involve a sequence of fabrication steps that result in a gate with adjacent source and drain, the source and drain being formed in a channel. Typically, an IC device can include different transistor device types including p-channel MOS (PMOS) transistors, n-channel MOS (NMOS) transistors, MOS field effect transistors (MOSFETs) tailored for digital or analog applications, high-voltage MOSFETs, high/normal/low frequency MOSFETs, MOSFETs optimized to work at distinct voltages or voltage ranges, low/high power MOSFETs, and low, regular, or high threshold voltage (Vt) transistors (i.e., low Vt (LVT), standard Vt (SVT), or high Vt (HVT)), etc. Transistor device types are usually distinguished by electrical performance characteristics (e.g., threshold voltage, speed, mobility, transconductance, linearity, noise, power), which can in turn lend themselves to be suitable for a particular application (e.g., signal processing, or data storage). Therefore, a complex IC device such as, for instance, a system on a chip (SoC), can use different transistor types (or a combination of one or more different transistor types) to achieve the target performance for different circuit blocks in the IC device.

The electrical performance characteristics of the different transistor device types in a SoC can be subject to variation due to manufacturing process variations, also referred to as the "manufacturing corner" of a particular transistor device. Typically, the electrical performance variation of the different transistor device types of the SoC can be different because the performance of each transistor device type is impacted differently by the manufacturing process variations.

DETAILED DESCRIPTION

Various embodiments of process monitor circuits will now be described below with reference to a number of drawings. These process monitor circuits can be used to determine the electrical performance variation of the different transistor types as a result of variations, including but not limited to: manufacturing process variations, body bias conditions, and/or operating conditions (e.g., temperature, supply voltage). The drawings depict various embodiments of the invention for the purposes of illustration only and are not intended to be limiting in any way. One skilled in the art will readily recognize from the following description that various embodiments of the structures and methods illustrated herein may be employed without departing from the principles of the embodiments described herein.

Figure 1A:
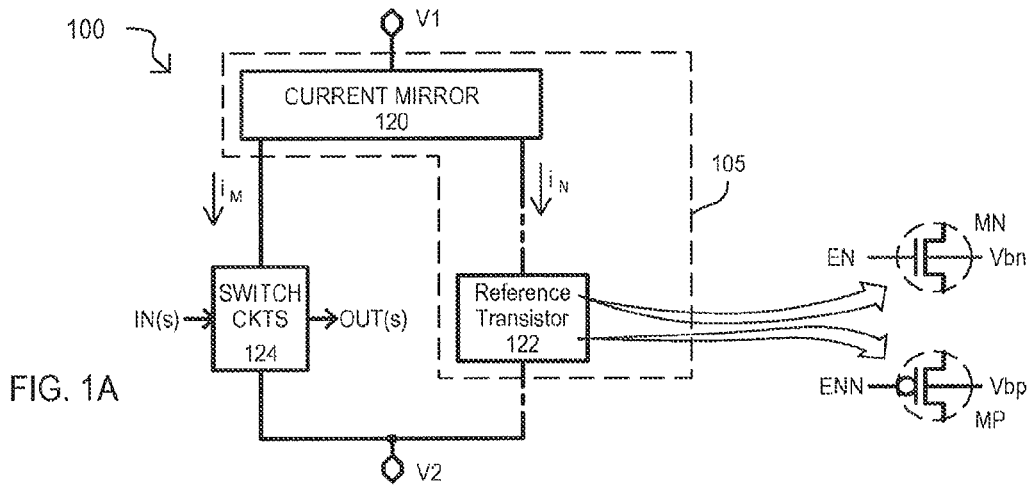
FIG. 1A is a block schematic view of a monitor circuit according to an embodiment.

FIG. 1A is a block schematic diagram of a monitor circuit 100 according to one embodiment. Monitor circuit 100 can vary a speed at which one or more output signals (OUT(s)) are generated from one or more input signals (IN(s)), based on the performance of one or more reference transistors 122. Thus, the performance of the monitor circuit 100 can vary in response to variation in the reference transistor(s) 122. According to embodiments, such variations in a reference transistor can arise from process variations, bias conditions, other operating conditions, or combinations thereof.

A monitor circuit 100 can include a current mirror section 105 and switching section 124 disposed between a first power supply node V1 and a second power supply node V2. A current mirror section 105 can include a current mirror circuit 120 and reference transistor(s) 122. A current mirror circuit 120 can include any suitable current mirror circuit that can mirror a current generated with reference transistor(s) 122 ($i_N$) to generate a mirrored current ($i_M$) for use by switching circuit 124. As will be shown in more detailed embodiments herein, a direction of currents $i_N$ and $i_M$ can vary according to the current mirror configuration (e.g., transistor conductivity type). A current mirror circuit 120 can be formed with transistors that are larger than reference transistor(s) 122, so that a current $i_N$ can vary predominantly according to reference transistor(s) 122, and substantially not in response to transistors of the current mirror circuit 120. More particularly, transistors of current mirror circuit 120 can have longer channels than those of reference transistor(s) 122. In some embodiments, transistors of current mirror circuit 120 can have channels that are both longer and wider than those of reference transistor(s) 122. Moreover, the reference transistor(s) 122 may be configured to match the performance of one or more of the switching circuit 124 transistors.

In some embodiments, a current mirror circuit 120 can provide one-to-one mirroring, with $i_N = i_M$. However, in alternate embodiments such a relationship can be scaled by relative sizing of current mirror transistors. In such cases, $i_N = K \cdot i_M$, where K is greater than, or less than one.

Reference transistor(s) 122 can be of an opposite conductivity type to transistors of current mirror circuit 120. A reference transistor 122 can be arranged so that the reference current $i_N$ flows through its source-drain path. A reference transistor 122 can be an insulated gate field effect transistor, referred to herein as a metal-oxide-semiconductor (MOS) transistor, but implying no particular type of gate insulator. As shown in FIG. 1A, reference transistor(s) 122 can include an n-channel (NMOS) transistor MN (in which case current mirror circuit 120 can be formed with p-channel MOS (PMOS) transistors) or a PMOS transistor MP (in which case current mirror circuit 120 can be formed with NMOS transistors).

Switching section 124 can receive one or more input signals (IN(s)), and generate therefrom one or more output signals (OUT(s)). A speed at which a corresponding output signal can be generated can vary according to the mirrored current $i_M$. In some embodiments, switching circuit 124 can logically invert input signal(s) IN(s) to generate output signal(s) OUT(s).

According to some embodiments, monitor circuit 100 can be one stage of a ring oscillator circuit composed of many such stages. Input signal(s) IN(s) can be output signals received from another stage of the ring oscillator circuit. Further, output signal(s) OUT(s) can be provided as input signals for another stage of the ring oscillator circuit.

Figure 1B:
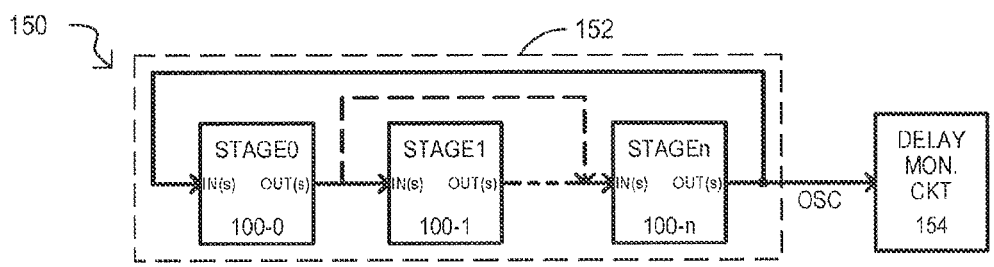
FIG. 1B is a block schematic diagram of a ring oscillator monitor circuit according to an embodiment.

FIG. 1B is a block schematic diagram of a ring oscillator monitor circuit 150 according to an embodiment. A circuit 150 can include a ring oscillator circuit 152 and a delay monitor circuit 154. A ring oscillator circuit 152 can include a number of stages 100-0 to 100-n arranged in a ring to generate an oscillating signal OSC having a frequency that varies according to the delay of each stage (100-0 to -n). Stages (100-0 to -n) can take the form of any of the monitor circuits shown herein, or equivalents. Thus, a delay introduced by one or all stages (100-0 to -n) can vary according to the reference transistors included within such stages, or in an embodiment where the reference and switching circuits are meant to have the same performance, to both the switching and reference devices of the reference type. Accordingly, an oscillating signal (OSC) speed/period will also vary according to the reference transistor(s).

A delay monitor circuit 154 can determine the speed of oscillating signal (OSC) according to any suitable technique (for instance, by measuring the period of oscillation). From such a value, the performance of reference transistors can be determined.

In particular embodiments, ring oscillator monitor circuit 150 can be formed in an integrated circuit (IC) device having other sections formed with transistors that match the reference transistors (i.e., are created with same fabrication process steps, but are not necessarily the same size). The performance of the reference transistors can thus reflect the performance of the transistors in such other sections. Using such performance values, the operation conditions of the other transistors in the other sections can be adjusted. Such adjustments can take any suitable form, including changing a body biasing, a power supply level, or configuring field programmable circuits to vary signals paths, as but a few examples.

Figure 1C:
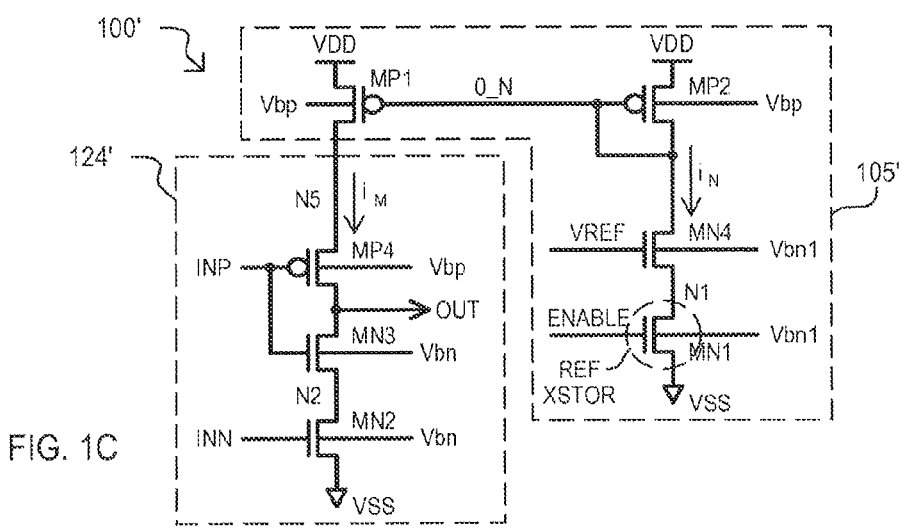
FIG. 1C is schematic diagram of a monitor circuit according to another embodiment.

FIG. 1C shows a monitor circuit 100' according to another embodiment. A monitor circuit 100' can be one stage of a ring oscillator circuit that can be used to measure the variation of NMOS transistors with substantially no contribution from the variation of PMOS transistors. In one embodiment, a monitor circuit 100' can be one very particular implementation of that shown in FIG. 1A.

A monitor circuit 100' can include a current mirror section 105' and switching section 124'. Current mirror section 105' can include a current mirror circuit formed by PMOS mirror transistors (MP1/MP2), an NMOS bias transistor MN4, and an NMOS reference transistor MN1. PMOS transistor MP2 can have a source connected to receive high power supply voltage (VDD) and a gate and drain connected to a bias node 0_N. PMOS transistor MP1 can have a source connected to receive VDD and a gate connected to bias node (0_N). In the embodiment shown, mirror transistors MP1/MP2 can receive a body bias voltage Vbp. In some embodiments, such a body bias voltage can be VDD. However, in other embodiments, such a body bias voltage can be a reverse body bias voltage (i.e., greater than VDD) or a forward body bias voltage (i.e., less than VDD). Mirror transistors MP1/MP2 can be larger than reference transistor (MN1).

Bias transistor MN4 and reference transistor MN1 can have source-drain paths connected in series between bias node (0_N) and a low power supply voltage node (VSS). Transistor MN4 can receive a reference voltage VREF at its gate, while transistor MN1 can receive an enable signal ENABLE at its gate. Accordingly, a reference current $i_N$ drawn through transistors MN4/MN1 will be mirrored by mirror transistor MP1 to generate a mirror current $i_M$. In the embodiment shown, transistors MN4/MN1 can receive a body bias voltage Vbn1. In some embodiments, such a body bias voltage can be VSS. However, in other embodiments, such a body bias voltage can be a reverse body bias voltage (i.e., less than VSS) or a forward body bias voltage (i.e., greater than VSS).

Switching circuit 124' can include a PMOS first switching transistor MP4, an NMOS second switching transistor MN3, and an NMOS third switching transistor MN2 having source-drain paths arranged in series between node N5 (the drain-drain connection of MP1/MP4) and VSS. The gates of transistors MP4 and MN3 can receive a first input signal INP. A gate of transistor MN2 can receive a second input signal INN. A drain-drain connection of MP4/MN3 can be an output node OUT that provides an output signal. In the embodiment shown, switching transistors MP3 can receive body bias voltage Vbp. Further, transistors MN3/MN2 can receive a body bias voltage Vbn. In some embodiments, such a body bias voltage can be VSS. However, in other embodiments, such a body bias voltage can be a reverse body bias voltage or forward body bias voltage. Body bias voltage Vbn can be the same as, or different than Vbn1.

In particular embodiments, a body bias voltage Vbn applied to NMOS transistors MN2 and MN3 is set to VSS. In alternative embodiments, the NMOS body bias voltages Vbn1 and Vbn are both set to a voltage that is less than VSS (i.e., a negative voltage if VSS=0V), and both Vbn1 and Vbn are set to the same voltage.

The primary capacitive load for monitor circuit 100' is the PMOS transistor MP4. This capacitive load is discharged through the NMOS pull down transistor MN2. The pull up mirrored current $i_M$ that charges this capacitive load, i.e., the current flowing through node N5, is provided by the current mirror section 105'. The current mirror section 105' includes PMOS transistor MP1 that mirrors PMOS transistor MP2, which varies according to NMOS reference transistor MN1. The magnitude of the pull up current $i_M$ is set by the current mirror 105' reference current $i_N$, which tracks variations of the NMOS transistor MN1 and has substantially no contribution from variations of the PMOS transistors (MP1/MP2), due to their sizing.

The reference current $i_N$ is controlled by reference transistor MN1. Thus, monitor circuit 100' pull up and pull down slew rates are controlled by an NMOS device, with minimal contribution due to the PMOS devices. Consequently, the monitor circuit speed is predominantly dependent on the NMOS as-fabricated device characteristics. In one embodiment, the voltage VREF applied to the gate of MN4 can be set to approximately VDD/2 such that the current mirror circuit MP1/MP2 remains in saturation. In one embodiment, transistors MN2 and MN1 are sized identically so that the NMOS pull down and PMOS pull up (mirror) currents are nominally identical.

The monitor circuit 100' uses two complementary inputs INP and INN to avoid a DC current path when a ring oscillator circuit is operating. Typically, INP and INN are coupled to outputs of different stages of the ring oscillator circuit, such that INN is delayed by a predetermined duration of time with respect to INP. The delay between INN and INP can be obtained by coupling INP to an output of a ring oscillator circuit stage that is before the ring oscillator circuit stage that is coupled to INN. For example, INN can be coupled to the previous stage of the ring oscillator circuit and INP can be coupled to a stage that is five stages before the current stage. However, alternative embodiments can couple INN and INP to other stages of the ring oscillator circuit to provide different delays between INN and INP as these vary depending on the ring oscillator circuit length and loading.

In certain embodiments, the width and length of the transistor MN1 can be substantially identical to those of pull-down device of the switching circuit (i.e., MN2). As noted above, current mirror section 105 is implemented such that the reference current $i_N$ is sensitive to process variations for the reference transistor MN1, and substantially insensitive to process variations for the other transistors in the current mirror circuit MP1/MP2. Typically, a small transistor is susceptible to random variation, and a transistor weakened using a long channel length is not representative of a typical logic transistor and will not vary with manufacturing corner. Therefore, in one embodiment the transistor MN1 and transistor MN2 are minimum channel length transistors (as is normal in logic transistors) in order to increase the effect of process variation for these transistors, and the other transistors of the monitor circuit 100' are large in order to reduce the effect process variation on these transistors. Current mirror 105' may use large PMOS transistors MP1 and MP2, such that the electrical characteristics of these PMOS transistors is substantially unaffected by manufacturing process variations.

Referring still to FIG. 1C, monitor circuit 100' can be conceptualized as an NMOS sensitive ring oscillator circuit stage that provides a stage delay between the input signal INN and the output signal OUT, where the stage delay varies in response to the as fabricated "manufacturing corner" of the NMOS reference transistors MN1 (and MN2). According to embodiments, the reference transistor MN1 (and MN2) can be designed to be representative of one or more group of transistors used to implement the IC device. For example, ring oscillator circuit stages using NMOS low voltage (LVT), standard voltage (SVT), or high voltage (HVT) transistor types as the reference transistor can be used for ring oscillator circuits that monitor the performance of these transistor types, respectively.

Figure 2A:
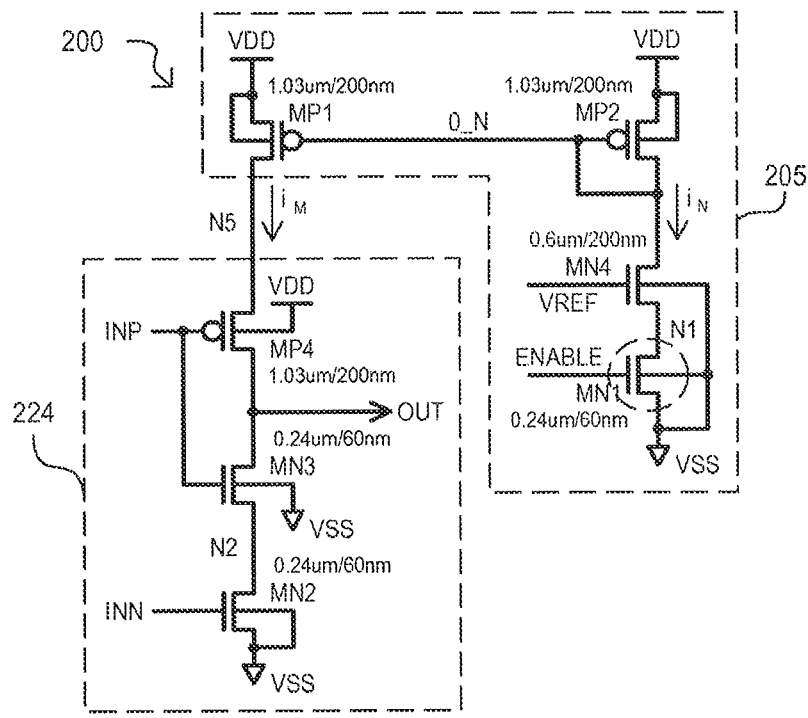
FIGS. 2A to 2D are schematic diagrams of monitor circuits according to various other embodiments.

FIG. 2A shows a monitor circuit 200 that can serve as an NMOS sensitive ring oscillator stage according to another embodiment. In one embodiment, a monitor circuit 200 can be one very particular implementation of that shown in FIG. 1A or 1C. A monitor circuit 200 can include items like those of FIG. 1C, and such like items are referred to by the same reference characters, but with the leading character being a "2" instead of a "1".

FIG. 2A differs from FIG. 1C in that particular transistor sizes are shown. Transistor channel widths (W) are shown in microns (um) and lengths (L) are shown in nanometers (nm). As shown, a reference transistor MN1 can have a size (W/L) of 0.24 um/60 nm. At the same time, mirror transistors MP1/MP2 can be considerably larger (1.03 um/200 nm). A bias transistor MN4 can also be larger than the reference transistor MN1, having a W/L of 0.6 um/200 nm. In the embodiment shown, transistors MN3 and MN2 in switching circuit 224 have sizes that match the reference transistor MN1. Transistor MP4 of switching circuit can have a same size as mirror transistors MP1/MP2.

FIG. 2A also differs from FIG. 1C in that PMOS transistors MP1, MP2 and MP4 have bodies biased at a high power supply voltage VDD. Further NMOS transistors MN1, MN2, MN3 and MN4 can have bodies biased to a low power supply voltage VSS.

Figure 2B:
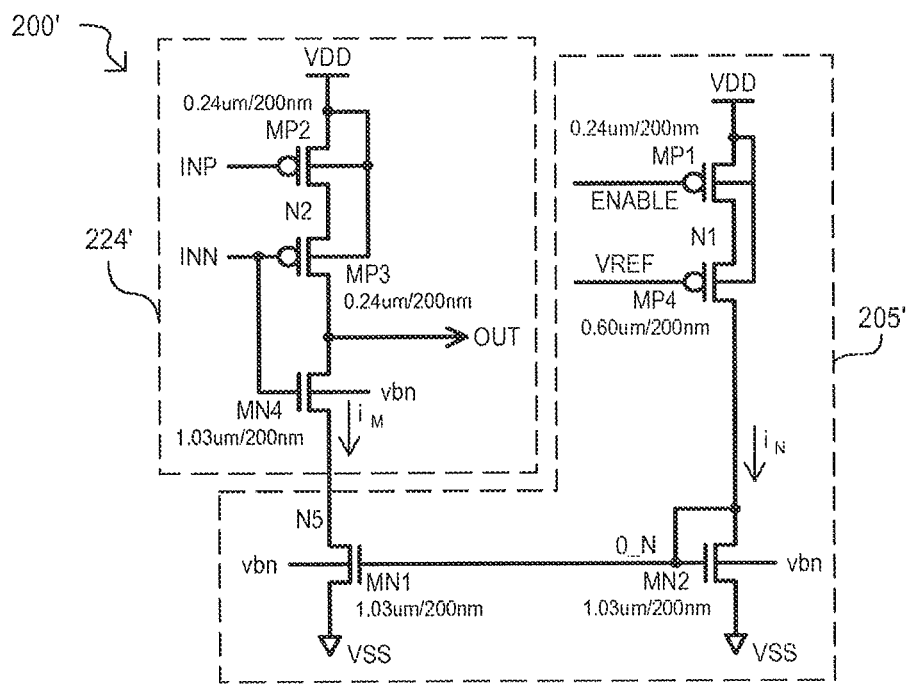

FIG. 2B shows a monitor circuit 200' that can serve as a PMOS sensitive ring oscillator stage according to another embodiment. In one embodiment, a monitor circuit 200' can be one very particular implementation of that shown in FIG. 1A. A monitor circuit 200' can include items like those of FIG. 1O, and such like items are referred to by the same reference characters, but with the leading character being a "2" instead of a "1".

A monitor circuit 200' can be used to measure the variation of PMOS transistors with substantially no contribution from the variation of NMOS transistors, in accordance with one embodiment. In the embodiment shown in FIG. 2B, the circuit pull up and pull down slew rates are controlled by a PMOS reference transistor MP1, with minimal contribution due to the NMOS devices. Consequently, the circuit speed is predominantly dependent on the PMOS as-fabricated device characteristics. Ring oscillator stages using PMOS LVT, SVT, or HVT transistor types as the reference transistor can be used in alternative embodiments to monitor the performance of the corresponding transistor types, respectively.

FIG. 2B shows a circuit like that of FIG. 2A, but with transistor conductivity types reversed. Further, in the embodiment shown, PMOS transistors MP1, MP2, MP3 and MP4 can have bodies biased to VDD, while NMOS transistors MN1, MN2 and MN3 can have bodies biased to Vbn. As in the case of FIG. 1C, Vbn can be VSS, a reverse body bias, or a forward body bias.

It is noted that the transistor sizes shown in FIGS. 2A and 2B are provided as exemplary embodiments only, and alternative embodiments of these circuits can use different transistor sizes as required by the desired sensitivity and specific CMOS process and/or circuit response.

Figure 2C:
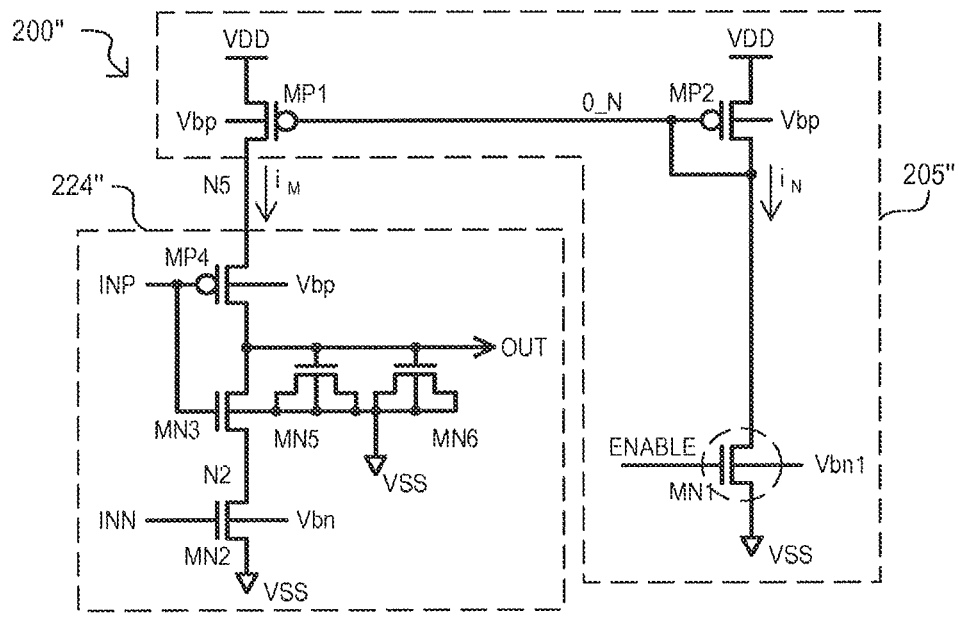
Figure 2D:
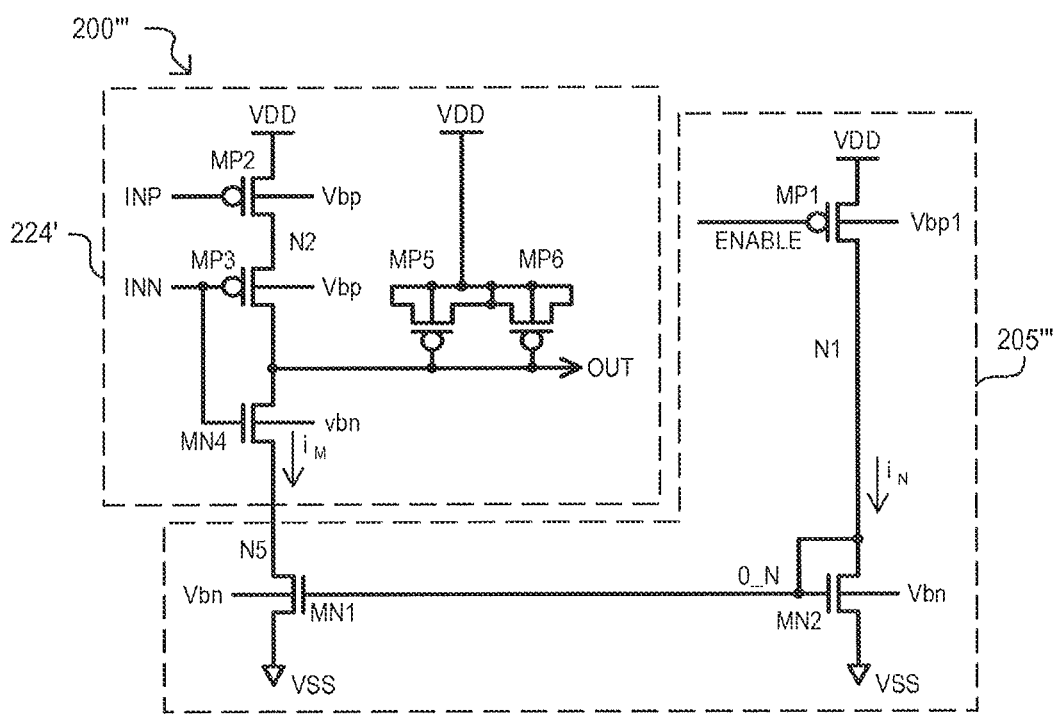

FIGS. 2C and 2D illustrate alternative embodiments of monitor circuits that can serve as NMOS sensitive and PMOS sensitive ring oscillator stages, respectively. FIG. 2C shows a monitor circuit 200" that can serve as an NMOS sensitive ring oscillator stage according to an embodiment. In one embodiment, a monitor circuit 200" can be one very particular implementation of that shown in FIG. 1A. A monitor circuit 200" can include items like those of FIG. 2A, and such like items are referred to by the same reference characters, but with the leading character being a "2" instead of a "1". Monitor circuit 200" can include a current mirror section 205" and a switching circuit 224".

FIG. 2C differs from FIG. 2A in that particular transistor sizes are not shown. However, in some embodiments transistor sizes can correspond to those of FIG. 2A.

FIG. 2C also differs from FIG. 2A in that it does not include a bias transistor (shown as MN4 in FIG. 2A). Thus, reference transistor MN1 has a drain connected to bias node 0_N. Further, the embodiment of FIG. 2C uses NMOS transistors MN5/MN6 as a capacitive gate load. In particular, transistors MN5/MN6 can have gates connected to output node OUT and drains/sources/bodies connected to VSS.

In the particular embodiment of FIG. 2C, PMOS transistors MP1, MP2 and MP3 can receive a body bias voltage Vbp. Body bias voltage Vbp can be VDD, a reverse body bias, or a forward body bias. NMOS transistor MN1 can receive a body bias voltage of Vbn1, which can be VSS, a reverse body bias, or a forward body bias. NMOS transistor MN2 can receive a body bias voltage of Vbn, which can be VSS, a reverse body bias, or a forward body bias. In some embodiments, Vbn1=Vbn, while in other embodiments they can be different.

FIG. 2D shows a circuit like that of FIG. 2C, but with transistor conductivity types reversed. Thus, PMOS transistors MP5/MP6 can serve as a capacitive gate load. Body biases can vary as described for FIG. 2C. Monitor circuit 200''' can include a current mirror section 205''' and a switching circuit 224'''.

Figure 3A:
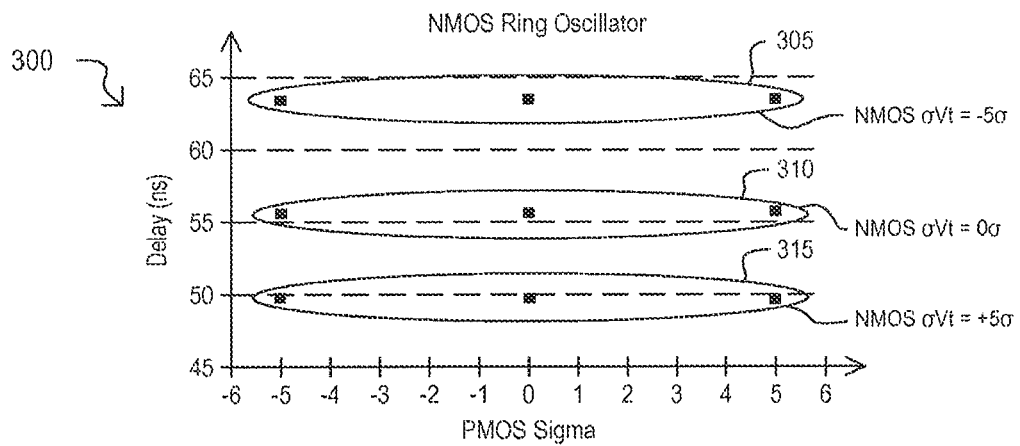
FIGS. 3A and 3B are graphs showing how delays produced by monitor circuits, according to embodiments, vary according to transistor variation.

FIG. 3A is a graph 300 showing the delay of a monitor circuit according to variations in transistor threshold values (Vts) of both PMOS and NMOS transistors. In particular, FIG. 3A shows a ring oscillator of 17 stages, where each stage takes the form of a monitor circuit like that shown as 100' in FIG. 1C. Points are provided for different deviations in Vts of both PMOS and NMOS transistors.

FIG. 3A includes three data sets 305, 310 and 315. Data set 305 shows the ring oscillator delay for an NMOS variation (σVt) of −5σ as the PMOS σVt varies between −5σ and +5σ. Data set 310 shows the ring oscillator delay for an NMOS σVt of 0 as the PMOS σVt varies between −5σ and +5σ. Data set 315 shows the ring oscillator delay for an NMOS σVt of +5σ as the PMOS σVt varies between −5σ and +5σ. The graph 300 of FIG. 3A shows that the ring oscillator delay varies in response to NMOS Vt variations and has substantially no dependence on PMOS Vt variations, i.e., the delay for a given NMOS σVt is substantially constant with respect variations in PMOS σVt.

Figure 3B:
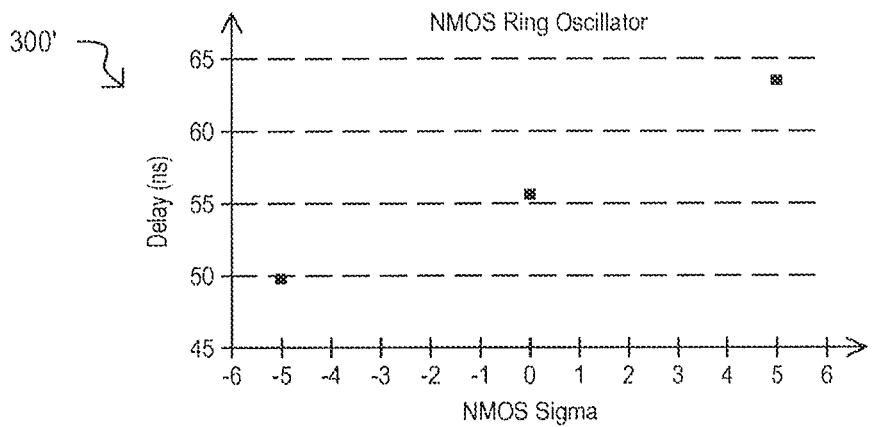

FIG. 3B is a graph 300' that shows the delay of an NMOS sensitive ring oscillator of FIG. 3A in response to NMOS Vt variation. In particular, FIG. 3B shows variations in ring oscillator delay in the presence of NMOS transistor threshold voltage (Vt) variations. FIG. 3B shows that the delay of the NMOS sensitive ring oscillator varies strongly in response to the process corner for the NMOS transistors. This strong sensitivity to NMOS and negligible sensitivity to PMOS provides a high signal to noise for determining the as-fabricated NMOS systematic corner. Averaging due to multiple devices in a ring oscillator configuration can average the random variation components.

FIGS. 3A and 3B show that the delay of the NMOS sensitive ring oscillator can be used to determine the speed and power variation of the one or more group of transistors corresponding to the reference NMOS transistors MN1/MN2, in the presence of manufacturing process variations. In addition, the ring oscillator delay can be used to determine the as fabricated "manufacturing corner" of the reference NMOS transistors MN1/MN2. For example as shown in FIG. 3B, NMOS corners, which are less or more than 3σ can be determined by measuring the delay of the NMOS sensitive ring oscillator.

It is understood that PMOS process corners can be determined in a similar manner using PMOS sensitive ring oscillators that use ring oscillator stage embodiments sensitive to PMOS transistors, as described herein, or equivalents.

In one embodiment, an IC device can include more than one ring oscillator circuit, where each ring oscillator circuit is implemented using ring oscillator stages using different types of reference transistors that can determine the speed and power variation of different groups of transistors. For example, a first ring oscillator circuit can be used to determine the process corner of PMOS transistors on the IC and a second ring oscillator circuit can be used to determine the process corner of NMOS transistors on the IC. In addition or alternatively, as noted above, ring oscillator circuits can be dedicated to transistors having different Vt types (e.g., LVT, SVT, and HVT) and/or different body biases.

Figure 4:
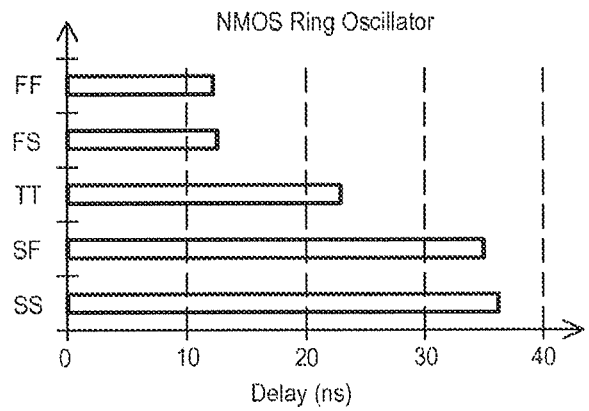
FIG. 4 is a graph showing the delay introduced by a ring oscillator circuit, having an n-channel reference transistor according to an embodiment, in response to process variation

FIG. 4 is a graph showing the delay of an NMOS sensitive ring oscillator delay for different NMOS and PMOS process corners. The delays for five different process corners are shown, i.e., SS corner for slow NMOS and slow PMOS transistors, SF corner for slow NMOS and fast PMOS transistors, TT for typical NMOS and PMOS transistors, FS for fast NMOS and slow PMOS transistors, and FF for fast NMOS and fast PMOS transistors. It is noted from the figure that the NMOS sensitive ring oscillator delay varies in response to different NMOS corners, and has substantially no variation in response to different PMOS process corners. For example, the delays for SF and SS corners, and FS and FF corners are substantially similar. However the NMOS sensitive ring oscillator delay is different for different NMOS corners, i.e., the delays for the SS/SF, TT, and FF/FS corners are different.

Various embodiments of the ring oscillator circuits described herein, and equivalents, can be advantageously used to measure the variation of performance characteristics within IC devices. The ring oscillator circuits can determine the manufacturing process corners in the presence of manufacturing process variations to facilitate setting design targets for devices. The ring oscillator circuits can also be used to measure the variation of PMOS and NMOS transistors separately, and therefore, permit independent determination of the PMOS and NMOS transistor manufacturing process corners. Different ring oscillator circuits can also be used to measure the variation of different transistor types separately, e.g., the manufacturing corners of LVT, SVT, and HVT transistors can be independently determined by using ring oscillator circuits having reference LVT, SVT, and HVT transistors, respectively. Advantageously, the ring oscillator circuits described above can be used to determine process corners during a manufacturing test, since the ring oscillator delay measurement can be performed in a short time.

The ring oscillator circuits and associated techniques described herein can also be used as part of a body bias control circuit in an IC device, in accordance with embodiments. A body bias control circuit can adjust the body bias voltage for one or more groups of transistors in an IC to provide a predetermined target transistor performance in the presence of manufacturing process variations. Such body bias control circuits can use the ring oscillator embodiments described above as part of the procedure to adjust the body bias voltage to compensate for transistor performance variations resulting from the manufacturing process corners. For example, a ring oscillator delay data generated by a ring oscillator circuit according to embodiments can be used to measure the transistor speed variation resulting from manufacturing process variations and the body bias voltage can be adjusted in response to the delay data to obtain a target transistor speed. In one embodiment, the target transistor speed is used to determine a target ring oscillator delay, and the bias voltage is adjusted until the measured ring oscillator delay is substantially equal to the target ring oscillator delay. In one embodiment, this setting is performed once per die, e.g., at manufacturing test.

In one embodiment, a ring oscillator circuit can be used as part of a continuous feedback system, where the ring oscillator is used in a body bias control circuit to monitor the performance of one or more types of transistors in the IC as the body bias voltage is adjusted so that the body bias voltage can be adjusted to compensate for manufacturing process variations as well as environmental, e.g., temperature, variations and obtain a target transistor performance for one or more of the transistor types. Such ring oscillator circuits preferably have a smooth and predictable response to body bias voltage.

Figure 5A:
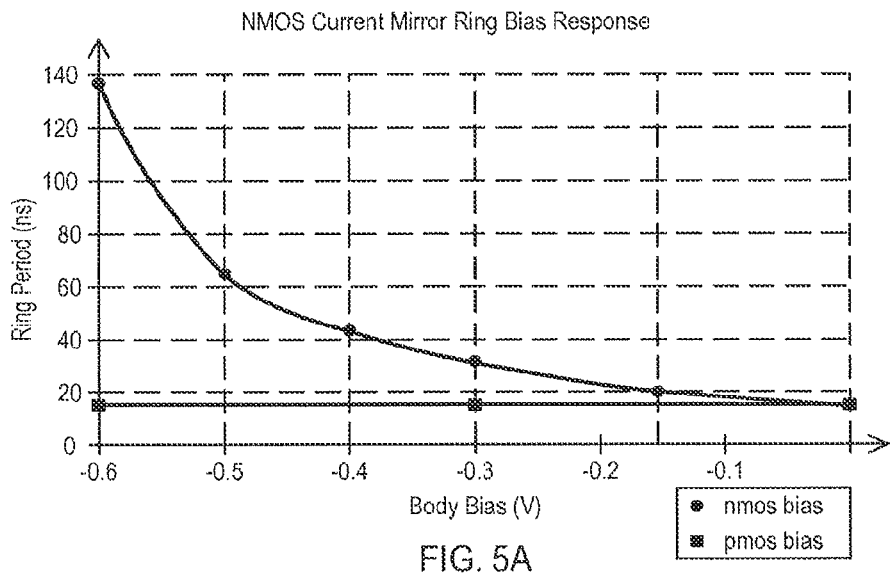
FIG. 5A is a graph showing the delay introduced by a ring oscillator circuit, having an n-channel reference transistor, for body bias variations in both n-channel and p-channel transistors, according to embodiments.

FIG. 5A shows the speed of the NMOS sensitive ring oscillator circuit described with reference to FIG. 3A (i.e., using monitor circuit 100' of FIG. 1C) for different combinations of NMOS and PMOS body bias voltages. It is noted that the NMOS sensitive ring oscillator circuit shows high sensitivity to NMOS body bias and low sensitivity to PMOS body bias. It is also noted from the figure that the response to NMOS bias voltage is nonlinear. In alternative embodiments, a body bias voltage for a reference transistor (Vbn1) can be set to VSS to make the delay response of the NMOS sensitive ring oscillator circuit more linear. It is understood that PMOS sensitive ring oscillator circuits can be used in a similar manner to monitor PMOS transistor performance as the body bias voltage is adjusted to achieve target transistor performance in order to compensate for manufacturing process variations. Thus, these ring oscillator circuits can be used to independently adjust body bias voltages for NMOS and PMOS transistors to compensate for manufacturing process variations, i.e., process corners, for these transistors. In alternative embodiments, the ring oscillator circuits described herein can also be used to monitor transistor performance and compensate for transistor performance due to other factors, such as operating temperature or aging of the IC device, continuously, during the operation of the IC device.

Figure 5B:
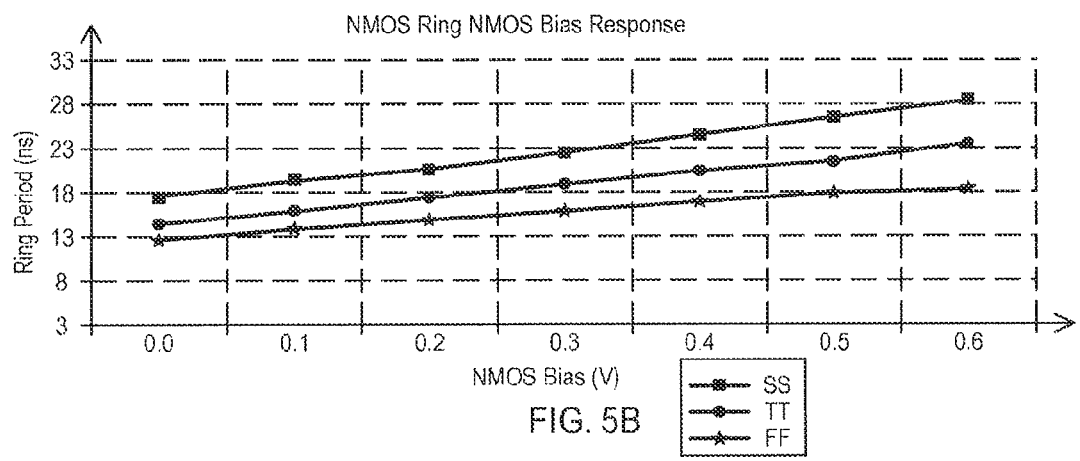
FIG. 5B is a graph showing the delay introduced by a ring oscillator circuit, having an n-channel reference transistor, for n-channel body bias variations and process variation corners, according to embodiments.

FIG. 5B shows the speed of a NMOS sensitive ring oscillator circuit formed with monitor circuits like that shown as 200″ in FIG. 2C at three different process corners (SS, TT, and FF) for different NMOS body bias voltages.

Figure 5C:
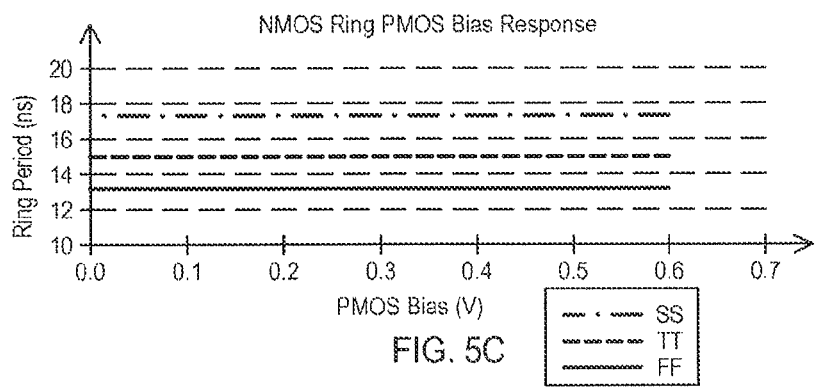
FIG. 5C is a graph showing the delay introduced by a ring oscillator circuit, having an n-channel reference transistor, for p-channel body bias variations and process variation corners, according to embodiments.

FIG. 5C shows the speed of the NMOS sensitive ring oscillator of FIG. 5B at three different process corners for different PMOS body bias voltages. It is noted from FIGS. 5B and 5C that the NMOS sensitive ring oscillator response varies substantially smoothly with the NMOS body bias voltage, but it is substantially insensitive to changes in the PMOS body bias voltage.

Figure 5D:
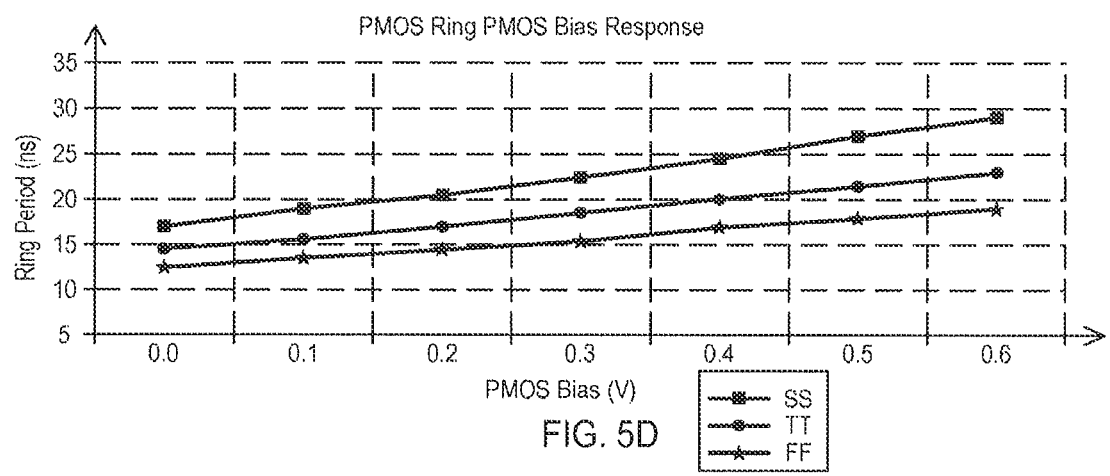
FIG. 5D is a graph showing the delay introduced by a ring oscillator circuit, having a p-channel reference transistor, for p-channel body bias variations and process variation corners, according to embodiments.

FIG. 5D shows the speed of a PMOS sensitive ring oscillator circuit formed with monitor circuits like that shown as 200‴ in FIG. 2D at three different process corners (SS, TT, and FF) for different PMOS body bias voltages.

Figure 5E:
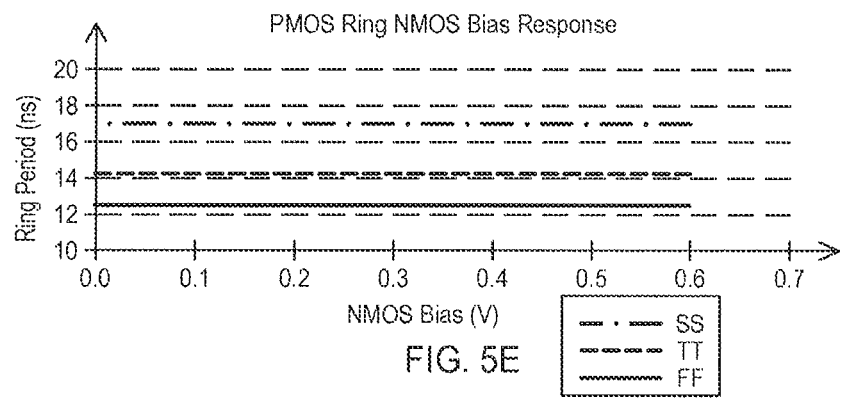
FIG. 5E is a graph showing the delay introduced by a ring oscillator circuit, having a p-channel reference transistor, for n-channel body bias variations and process variation corners, according to embodiments.

FIG. 5E shows the speed of the PMOS sensitive ring oscillator of FIG. 5D at three different process corners for different NMOS body bias voltages. [PLEASE CHANGE FIG. 5E—TITLE NEEDS TO BE "PMOS Ring NMOS Bias Response"] It is noted from these figures that the PMOS sensitive ring oscillator response varies substantially smoothly with the PMOS body bias voltage, but it is substantially insensitive to changes in the NMOS body bias voltage.

Embodiments can include monitor circuits which can be disabled to reduce power consumption when not in use. Examples of such embodiments will now be described with reference to FIGS. 6A to 6C.

Figure 6A:
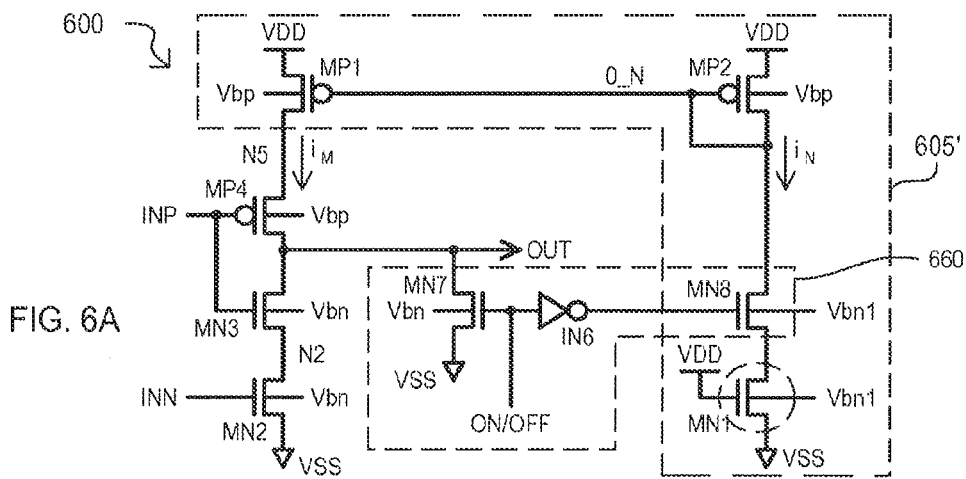
FIGS. 6A to 6C are schematic diagrams of monitor circuits that can be disabled according to various other embodiments.

FIG. 6A shows a monitor circuit 600 according to another embodiment. Monitor circuit 600 can serve as one stage in a ring oscillator circuit. Monitor circuit 600 can be disabled in response to an ON/OFF signal. A monitor circuit 600 can include items like those of FIG. 1C, and such like items are referred to by the same reference character.

FIG. 6A differs from FIG. 1C in that it does not include a bias transistor MN4, but does include a disable circuit 660 which can disable the operation of the monitor circuit 600 by gating the reference current $i_N$ of the current mirror circuit MP1/MP2, and by discharging the capacitive load of PMOS transistor MP4. Further, reference transistor MN1 can have a gate that receives a high power supply voltage VDD. In other embodiments, reference transistor MN1 can receive an enable signal.

In the embodiment shown, disable circuit 660 can include an NMOS gating transistor MN8, an NMOS discharge transistor MN7, and an inverter IN6. Gating transistor MN8 can have a source-drain path connected between bias node 0_N and the drain of reference transistor MN1, and a gate connected to the output of inverter IN6. Inverter IN6 can have an input that received the ON/OFF signal. Discharge transistor MN7 can have a source-drain path connected between the output node OUT and a low power supply voltage node VSS, and a gate connected to receive the ON/OFF signal.

When signal ON/OFF is high, discharge transistor MN7 can turn on, discharging output node OUT to VSS. By operation of inverter IN6, gating transistor MN8 can be turned off, stopping the flow of reference current $i_N$, and thus mirrored current $i_M$, as well. When signal ON/OFF is low, discharge transistor MN7 is off. By operation of inverter IN6, gating transistor MN8 can be turned on, enabling the flow of reference current $i_N$, as well as mirrored current M.

In one particular implementation of FIG. 6A, relative W/L sizes of transistors can be as follows: PMOS transistors MP1/

MP2=10/0.2; PMOS transistor MP4=50/0.2; NMOS transistors MN1/MN2/MN3=0.1/0.06; and NMOS transistor MN8=0.25/0.2.

Conductivity and power supply connections of FIG. 6A can be reversed to arrive at a PMOS sensitive monitor circuit that can be disabled in the same general fashion.

Figure 6B:
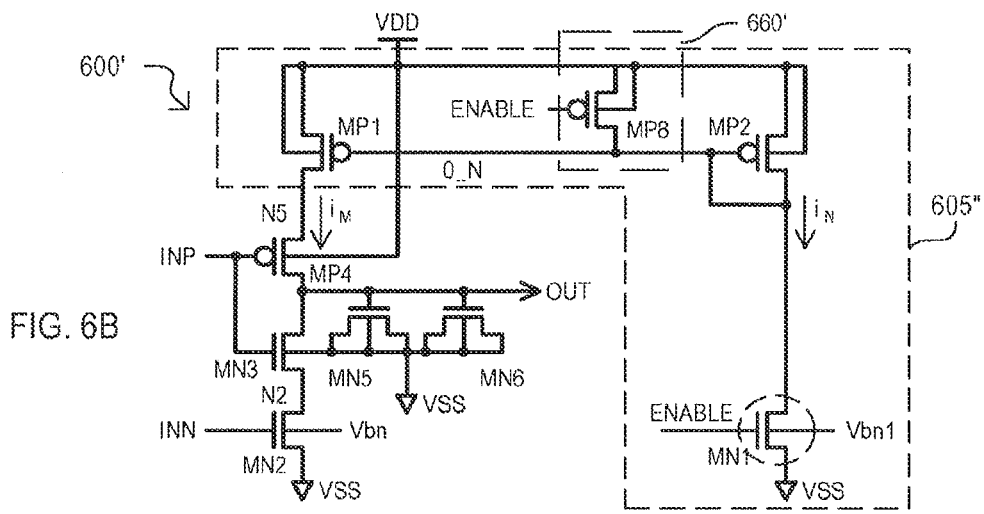

FIG. 6B shows a monitor circuit 600' according to another embodiment. Monitor circuit 600' can serve as an NMOS sensitive stage in a ring oscillator circuit, as described herein, and equivalents. Monitor circuit 600' can be disabled in response to the ENABLE signal. A monitor circuit 600 can include items like those of FIG. 2C, and such like items are referred to with the same reference characters.

FIG. 6B differs from FIG. 2C in that it can include a disable circuit 660' which can disable current mirror circuit MP1/MP2, to thereby stop the flow of reference current $i_N$ and mirrored current $i_M$. In the embodiment shown, disable circuit 660' can include a PMOS disable transistor MP8 having a source-drain path connected between the high power supply node VDD and bias node 0_N, and a gate that receives the ENABLE signal.

When the ENABLE signal is low, reference transistor MN1 can be turned off. In addition, disable transistor MP8 can be turned on, forcing a gate-source voltage of mirror transistors MP1/MP2 to zero, turning them off. When ENABLE is high, reference transistor MN1 can be turned on. In addition, disable transistor MP8 can be turned off, enabling mirror transistors MP1/MP2 to allow a reference current $i_N$ flowing through reference transistor MN1 and to be mirrored by current mirror MP1/MP2 to generate mirrored current $i_M$.

Figure 6C:
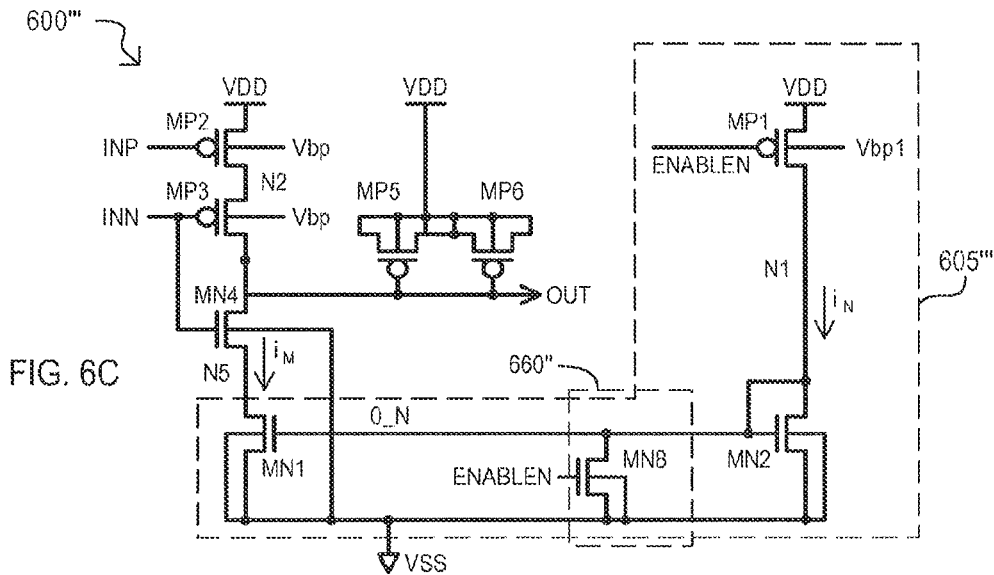

FIG. 6C shows a monitor circuit 600" according to a further embodiment. Monitor circuit 600" can serve as a PMOS sensitive stage in a ring oscillator circuit, as described herein, and equivalents. Monitor circuit 600" can be disabled in response to the ENABLEN signal. A monitor circuit 600" can include items like those of FIG. 2D, and such like items are referred to the same reference characters.

FIG. 6C differs from FIG. 2D in that it can include a disable circuit 660" which can disable current mirror circuit MN1/MN2, to thereby stop the flow of reference current $i_N$ and mirrored current $i_M$. In the embodiment shown, disable circuit 660" can include an NMOS disable transistor MN8 having a source-drain path connected between the low power supply node VSS and bias node 0_N.

When ENABLEN is high, reference transistor MP1 can be turned off. In addition, disable transistor MN8 can be turned on, forcing a gate-source voltage of mirror transistors MN1/MN2 to zero, turning them off. When ENABLEN is low, reference transistor MP1 can be turned on. In addition, disable transistor MN8 can be turned off, enabling mirror transistors MN1/MN2 to allow a reference current IN flowing through reference transistor MP1 to be mirrored by current mirror MN1/MN2 to generate mirrored current $i_M$.

The monitor circuits of FIGS. 6A and 6B can be included in ring oscillator circuits to measure the variation of NMOS transistors with substantially no contribution from the variation of PMOS transistors. Similarly, alternative embodiments, like that of FIG. 6C, can include a disable circuit and be sensitive to variation of PMOS transistors, while having no substantial contribution from the variation of NMOS transistors.

Figure 7A:
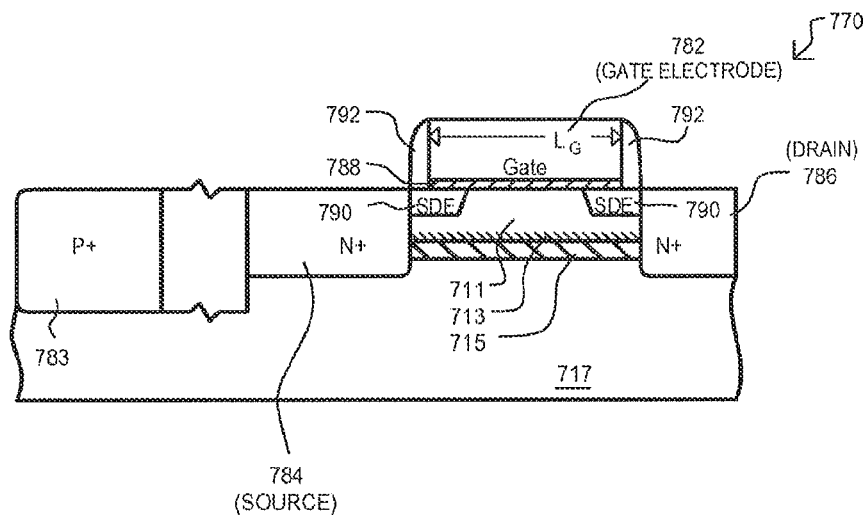
FIGS. 7A to 7C are side cross sectional representations of transistors that can be included in embodiments.

FIG. 7A shows a deeply depleted channel (DDC) type transistor 770, which can be included in embodiments. A benefit of DDC transistor 770 is in its enhanced body coefficient, along with the ability to set a threshold voltage (Vt) with enhanced precision. A DDC transistor 770 can include a gate electrode 782, source 784, drain 786, and a gate dielectric 788 positioned over a substantially undoped channel 711. Optional lightly doped source and drain extensions (SDE) 790 can be positioned respectively adjacent to source 784 and drain 786. Such extensions 790 can extend toward each other, reducing effective length of the substantially undoped channel 711.

In FIG. 7A, the DDC transistor 770 is shown as an n-channel transistor having a source 784 and drain 786 made of n-type dopant material, formed upon a substrate such as a p-type doped silicon substrate providing a p-well 717. In addition, the n-channel DDC transistor 770 in FIG. 7A can include a highly doped screening region 715 made of p-type dopant material, and a threshold voltage set region 713 made of p-type dopant material. In the embodiment shown, spacer sidewalls 792 can be formed on sides of gate electrode 782. A body bias can be applied to DDC transistor 770 via body tap 783.

Figure 7B:
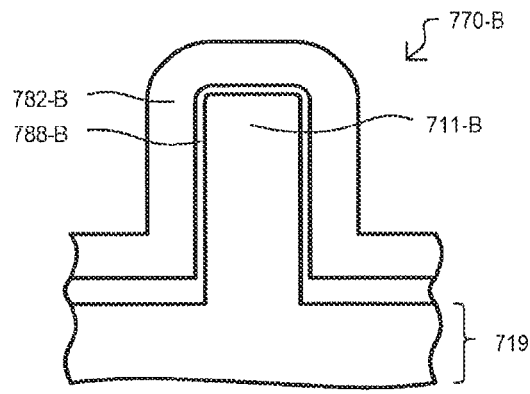

FIG. 7B shows a 3-dimensional FinFET type transistor 770-B which can be included in embodiments. The FinFET transistor 770-B can include a gate electrode 782-B and gate dielectric 788-B that surrounds a substantially undoped channel 711-B on opposing sides. The view of FIG. 7B is taken along a channel length. Thus, it is understood that source and drain regions can extend into and out of the view shown.

Figure 7C:
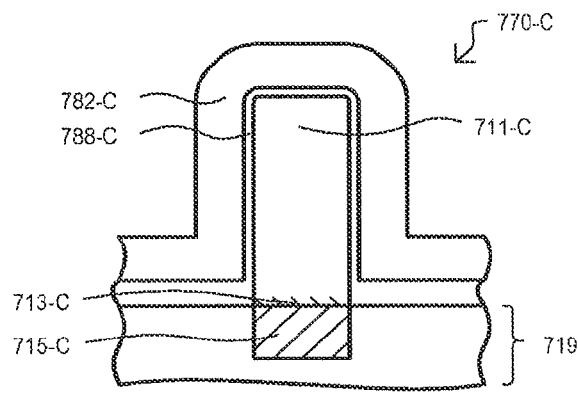

FIG. 7C shows a 3-dimensional FinFET type transistor 770-C having a screening region 715-C which can be included in embodiments. As in the case of FIG. 7A, the FinFET transistor 770-C has a screening region 715-C which provides the benefit of an enhanced body coefficient, along with the ability to set a Vt with enhanced precision. The transistor 770-C includes a gate electrode 782-C and gate dielectric 788-C formed over a substantially undoped channel 711-C on opposing sides. However, unlike 7B, a highly doped screening region 715-C is formed in a substrate 719 below substantially undoped channel 711-C. Optionally, a Vt set region 713-C is formed between the screening region 715-C and substantially undoped channel 711-C.

As in the case of FIG. 7B, the view of FIG. 7C is taken along a channel length, and source and drain regions can extend into and out of the view, separated from screening region 715-C by portions of undoped channel region 711-C.

Ring oscillator circuits comprised of monitor circuit delay stages sensitive to either PMOS or NMOS, as described herein and equivalents, can be particularly useful when comprised of, and used in IC devices using DDC transistors, due to the higher aforementioned strong body coefficient of the DDC device. Thus, the ring oscillators can be used to change NMOS and PMOS body biases, which vary independently, to target the IC device performance using applied body bias. It should be noted that the body biases may also be applied in concert with increased or reduced power supply voltage. Separate ring oscillators may be used for different Vt transistors, e.g., HVT, SVT, and LVT, or these may be combined into single ring oscillators with delay stages of mixed types, so as to represent the IC critical timing paths. Additionally, some stages may have high capacitive loads and transistor stacks to mimic circuit paths, such as IC device critical paths in a memory like a static random access memory (SRAM), or the like.

Figure 8:
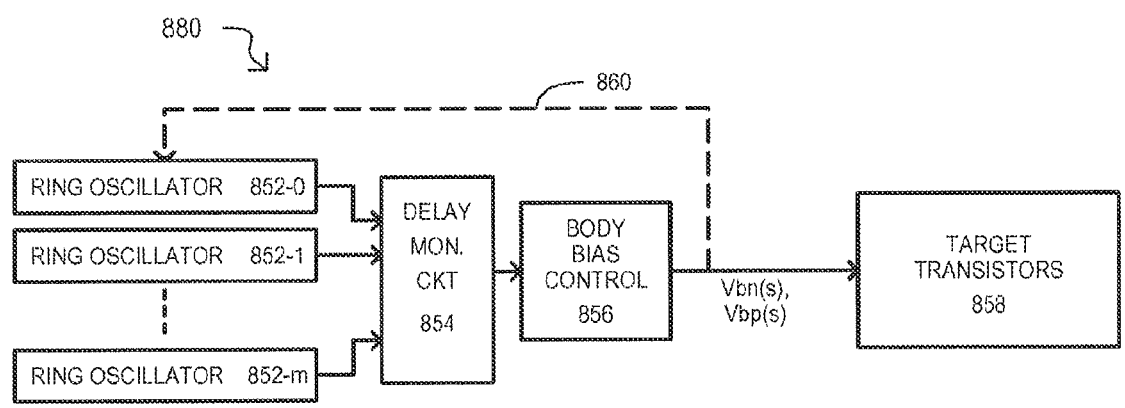
FIG. 8 is a block schematic diagram of an integrated circuit device according to an embodiment.

FIG. 8 is a block schematic diagram showing an IC device 880 according to an embodiment. IC device 880 can include a number of ring oscillator circuits 852-0 to -m, a delay monitor circuit 854, a body bias control circuit 856 and target transistors 858. Ring oscillator circuits (852-0 to -m) can include stages composed of monitor circuits as described herein, or equivalents. Thus, ring oscillator circuits (852-0 to -m) can output periodic signals having a delay (e.g., clock period, half-period) reflecting the performance of a particular transistor type (e.g., conductivity, threshold voltage, power supply, body bias).

Delay monitor circuit 854 can determine a delay of each ring oscillator circuit (852-0 to -m). In response to a delay determination delay monitor circuit 854, a body bias control circuit 856 can apply one or more body bias voltages (Vbn(s), Vbp(s)) to target transistors 858, to adjust their performance. In some embodiments, body bias voltage(s) can be applied to appropriate ring oscillator circuit(s) (852-0 to -m) via feedback path 860.

Embodiments of various structures and manufacturing processes suitable for use in DDC transistors are disclosed in U.S. Pat. No. 8,273,617, issued on Sep. 25, 2012, titled Electronic Devices and Systems, and Methods for Making and Using the Same, by Scott E. Thompson et al.; U.S. Pat. No. 8,530,286 issued on Sep. 10, 2013, titled "Low Power Semiconductor Transistor Structure and Method of Fabrication Thereof", by Lucian Shifren et al.; U.S. patent application Ser. No. 12/971,955 filed on Dec. 17, 2010 titled "Transistor with Threshold Voltage Set Notch and Method of Fabrication Thereof"; U.S. patent application Ser. No. 12/895,785 filed on Sep. 30, 2010 titled "Advanced Transistors With Threshold Voltage Set Dopant Structures"; and U.S. Pat. No. 8,400,219 issued on Mar. 19, 2013, titled "Analog Circuits Having Improved Transistors, and Method Therefor", by Lawrence T. Clark et al; the disclosures of which are hereby incorporated by reference in their entirety. In addition, methods and structures for modifying the threshold voltage of DDC transistors are discussed in pending U.S. patent application Ser. No. 13/459,971 titled "Multiple Transistor Types Formed in a Common Epitaxial Layer by Differential Out-diffusion from a Doped Underlayer", filed Apr. 30, 2012, the entirety of which disclosure is incorporated by reference herein.

It is understood that, with appropriate change to substrate or dopant material, conductivities of any of the transistors described above can be switched (i.e., from p-channel to n-channel and vice versa).

Ring oscillator circuits as described herein, and equivalents, can be advantageously used in IC devices that are implemented using DDC transistors as compared to conventional nanoscale devices. DDC transistors can have a wider response range for a change in the body bias voltage applied to the screening region, due to the benefits of the DDC transistor including the more reliable threshold voltage setting capability compared with conventional transistors of the same gate length. The enhanced body coefficient of DDC transistors can allow a broad range of ON-current and OFF-current that depends on the body bias voltage applied to the screening region, as compared to the body bias voltage applied to a conventional transistor having the same gate length. DDC transistors can have a better threshold voltage matching factor (AVT), i.e., a lower $\sigma V_T$ than conventional devices. The lower $\sigma V_T$ can enable designs having lower minimum operating voltage VDD and a wider range of available nominal values of $V_T$. The enhanced body coefficient of DDC transistors can allow for reliable application of body bias voltage to the screening region, as compared to the body bias voltage applied to a conventional device of the same gate length, particularly in gate lengths of 45 nm and smaller. The screening region of DDC transistors can allow for more effective body biasing which in turn provides better control of the operating conditions of a device or a group of devices with body biasing. In addition, different operating conditions can be set for devices or groups of devices as a result of applying different body bias voltages.

As will be understood, wafers and die supporting multiple transistor types, including those with and without the described dopant layers and structures are contemplated. Electronic devices that include the disclosed transistor structures or are manufactured in accordance with the disclosed processes can incorporate die configured to operate as "systems on a chip" (SoC), advanced microprocessors, radio frequency, memory, and other die with one or more digital and analog transistor configurations, and are capable of supporting a wide range of applications, including wireless telephones, communication devices, "smart phones", embedded computers, portable computers, personal computers, servers, and other electronic devices. Electronic devices can optionally include both conventional transistors and transistors as disclosed, either on the same die or connected to other die via motherboard, electrical or optical interconnect, stacking or through used of 3D wafer bonding or packaging. According to the methods and processes discussed herein, a system having a variety of combinations of analog and/or digital transistor devices, channel lengths, and strain or other structures can be produced.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
in a stage of a ring oscillator circuit,
mirroring a reference current flowing through a reference transistor with a current mirror circuit to generate a mirrored current,
the current mirror circuit comprising mirror transistors of a first conductivity type having channels lengths substantially larger than that of the reference transistor, and
controlling transitions in a stage output signal in response to a stage input signal with a switching circuit according to the mirrored current, wherein
the stage input signal is a stage output signal of another stage of the ring oscillator circuit,
generating a body bias in response to a difference between an oscillating signal generated by the ring oscillator circuit and a target data; and
applying the body bias to transistors of an integrated circuit that includes the ring oscillator circuit.

2. The method of claim 1, wherein:
the target data is determined based on a center of characteristic data of the ring oscillator circuit.

* * * * *